(12) United States Patent
Balcom et al.

(10) Patent No.: US 8,237,440 B2
(45) Date of Patent: Aug. 7, 2012

(54) MAGNETIC FIELD GENERATOR SUITABLE FOR UNILATERAL NUCLEAR MAGNETIC RESONANCE AND METHOD FOR MAKING SAME

(75) Inventors: Bruce J. Balcom, Fredericton (CA); Andrew E. Marble, Maberly (CA); Igor V. Mastikhin, Hanwell (CA); Bruce Colpitts, Fredericton (CA)

(73) Assignee: University of New Brunswick, Fredericton (CA)

( * ) Notice: Subject to any disclaimer, the term of this patent is extended or adjusted under 35 U.S.C. 154(b) by 1300 days.

(21) Appl. No.: 11/896,332

(22) Filed: Aug. 31, 2007

(65) Prior Publication Data

US 2012/0049849 A1    Mar. 1, 2012

Related U.S. Application Data

(63) Continuation-in-part of application No. 11/232,904, filed on Sep. 23, 2005, now Pat. No. 7,319,326.

(51) Int. Cl.
*G01V 3/00* (2006.01)
(52) U.S. Cl. .................... 324/318; 324/322
(58) Field of Classification Search .......... 324/300–322; 29/602, 607; 335/301, 296
See application file for complete search history.

(56) References Cited

U.S. PATENT DOCUMENTS

| | | | | |
|---|---|---|---|---|
| 4,445,102 A * | 4/1984 | Thorn et al. | | 335/297 |
| 6,204,665 B1 * | 3/2001 | Triebe et al. | | 324/318 |
| 6,694,602 B2 * | 2/2004 | Laskaris et al. | | 29/602.1 |
| 6,933,820 B2 * | 8/2005 | Doi et al. | | 335/301 |

(Continued)

FOREIGN PATENT DOCUMENTS

GB    2174247    10/1986
(Continued)

OTHER PUBLICATIONS

Guthausen et al., Analysis of Polymer Materials by Surface NMR via the MOUSE, Journal of Magnetic Resonance. 1998, pp. 1-7 130.

(Continued)

*Primary Examiner* — Brij Shrivastav
(74) *Attorney, Agent, or Firm* — Eugene F. Derenyi; Fogler, Ruhinoff LLP

(57) ABSTRACT

A unilateral NMR sensor comprising a ferromagnetic yoke; a permanent magnet arranged on the yoke; a pole piece on the magnet; the pole piece including an air-pole piece interface surface whose shape corresponds to an equipotential contour of magnetic scalar potential. An approach for designing single-sided magnets suitable for unilateral magnetic resonance (UMR) measurements is presented. The method uses metal pole pieces to shape the field from permanent magnets in a target region. The pole pieces are shaped according to solutions to Laplace's equation, and can be designed using a combination of analytical methods and numerical optimization. The design leads to analytical expressions for the pole piece shape and magnetic field. The method is developed in Cartesian, polar, and spherical coordinates, and the merits of each system are discussed. The effects of finite magnet size on the field quality are explored through simulation, and are found to have a substantial effect in many cases. A magnet is designed using our method to produce a static field with a constant gradient over a region 2 cm in diameter and 2 mm thick. This leads to a compact cylindrical magnet just over 11 cm in diameter, topped with a single metal pole piece. The design is validated through simulation. The simulated field is found to agree closely with that specified analytically through the design procedure.

56 Claims, 25 Drawing Sheets

U.S. PATENT DOCUMENTS 7,319,326 B2 * 1/2008 Balcom et al. .............. 324/318
2005/0128037 A1 6/2005 Doi et al.

FOREIGN PATENT DOCUMENTS

WO WO 93/14414 7/1993
WO WO 98/03887 1/1998

OTHER PUBLICATIONS

Popella et al, Design and Optimization of the Magnetic Circuit of a Mobile Nuclear Magnetic Resonance Device for Magnetic Resonance Imaging, The International Journal for Computation and Mathematics in Electrical and Electronic Engineering, 2001, vol. 20, No. 1, pp. 269-278.
Pederson et al, Application of the NMR-MOUSE to Food Emulsions, Journal of Magnetic Resonance, 2003, vol. 165, pp. 49-58.
Popella et al. Object-Oriented Genetic Algorithms for Two-Dimensional Design Optimization of the Magnetic Circuit of a Mobile Magnetic Resonance Device, International Journal of Applied Electromagnetics and Mechanics, 2001/2002, vol. 15, pp. 219-223.
Eidmann, G., et al, The NMR MOUSE, A Mobile Universal Surface Explorer, Journal of Magnetic Resonance, Series A, 1996, vol. 122, pp. 104-109.
Glover et al, A Novel High-Gradient Permanent Magnetic for the Profiling of Planar Films and Coatings, Journal of Magnetic Resonance, 1999, vol. 139, pp. 90-97.
Blümich et al, Simple NMR-Mouse with a bar magnet, Concepts in Magnetic Resonance B 15, 2002, pp. 255-261.
Guthausen et al., Soft-matter analysis by the NMR-MOUSE, Macromol. Mater. Eng. 276/277, 2000, pp. 25-37.
Nelder et al., A Simplex Method for Function Minimization, The Computer Journal, 1965, vol. 7, pp. 308-331.
McDonald et al., Two-dimensional correlation relaxometry studies of cement pastes performed using a new one-sided NMR magnet, Current and Concrete Research, 2007, vol. 37, pp. 303-309.
Luong et al., Optimal Control Technique for Magnet Design in Inside-Out Nuclear Magnetic Resonance, IEEE Transactions on Magnetics, 2001, vol. 37:2, pp. 1015-1023.
Marble et al., An analytical methodology for magnetic field control in unilateral NMR, Journal of Magnetic Resonance, 2005, vol. 174, pp. 78-87.
Marble et al., A constant gradient unilateral magnet for near-surface MRI profiling, Journal of Magnetic Resonance, 2006, vol. 183, pp. 228-234.
Perlo et al., Profiles with microscopic resolution by single-sided NMR, Journal of Magnetic Resonance, 2005, vol. 176, pp. 64-70.

* cited by examiner

MAGNETIC FIELD GENERATOR SUITABLE FOR UNILATERAL NUCLEAR MAGNETIC RESONANCE AND METHOD FOR MAKING SAME

CROSS-REFERENCE TO RELATED APPLICATIONS

This is a continuation-in-part of U.S. patent application Ser. No. 11/232,904 filed on the 23 of September 2005 now U.S. Pat. No. 7,319,326, entitled "SENSOR FOR UNILATERAL NUCLEAR MAGNETIC RESONANCE AND METHOD OF MAKING THE SAME", the entirety of which is hereby incorporated herein by reference.

MICROFICHE APPENDIX

Not applicable.

TECHNICAL FIELD

This application relates to nuclear magnetic resonance techniques in general, and to a magnetic field generator suitable for unilateral nuclear magnetic resonance and method for making same, in particular.

BACKGROUND OF THE INVENTION

In a conventional nuclear magnetic resonance (NMR) experiment, the sample under study is placed in a homogeneous magnetic field produced by a superconducting solenoid. While this facilitates high signal-to-noise (SNR) and spatially resolved magnetic resonance imaging (MRI), it limits the range of samples that can be examined. In recent years, this limitation has been addressed by the introduction of 'inside out' or unilateral NMR sensors in which, the fringe field from a permanent magnet array is used to generate the static $B_0$ field in a volume displaced (remote) from the device. A surface coil or an alternate RF probe geometry is used to generate a remote $B_1$ field. The shapes of these inhomogeneous fields define a 'sensitive volume' or 'sensitive spot' where components of the two fields are orthogonal. Designs of this type allow near surface measurements to be made on samples of arbitrary sizes previously inaccessible to NMR. Furthermore, small permanent magnet designs are easily transported, making them suitable for field applications. The strong gradient inherent in these designs can be exploited to investigate slowly diffusing samples, or to suppress the signal from rapidly diffusing samples.

Inside-out NMR was first used in the oil industry for well logging. Later, Eidmann et al. developed a portable unilateral NMR sensor known as the NMR-MOUSE (see G. Eidmann, R. Savelsberg, P. Blümler, B. Blümich, The NMR MOUSE, a mobile universal surface explorer, J. Magn. Res. A 122 (1996) 104-109). The Eidmann design employs a 'U' magnet geometry in which two permanent magnets are arranged on a ferromagnetic yoke in opposite orientations with a gap between them. The $B_0$ field curls between the two magnets, giving a component parallel to their faces in the area over the gap. A surface coil in the gap with its axis normal to the face of the magnets provides the $B_1$ field.

Significant drawbacks exist with the NMR-MOUSE. The $B_0$ field provided by the magnet array is inhomogeneous in all directions and suffers from a strong (10-50 T/m), nonlinear gradient in the direction normal to the array. This results in short signal lifetimes, obscuring chemical shift information and resulting in low SNR measurements. The strong nonlinearity of the gradients results in an ill defined sensitive volume precluding conventional spatially resolved measurements. The strong gradient causes every RF excitation to be slice selective; the size, shape, and position of the excited volume are determined by the bandwidth and frequency of the RF pulse sequence used. These effects limit the effective resolution of the sensor by obscuring the location and distribution of the spin population observed in a measurement. The strong gradient also requires additional RF circuitry to be employed in order to vary the excitation frequency over a wider range in spatially resolved measurements.

To address the drawbacks of early unilateral NMR systems, several designs have been proposed. Using a single bar magnet to provide $B_0$, Blümich et al. developed a unilateral NMR sensor with a small sensitive volume directly over one of the poles of the magnet (see B. Blümich, V. Anferov, S. Anferova, M. Klein, R. Fechete, M. Adams, F. Casanova, Simple NMR-mouse with a bar magnet, Concepts in Magnetic Resonance B 15 (2002) 255-261). In this volume, the gradient parallel to the magnet face is negligible while the gradient normal to the magnet face is strong but approximately linear. While this design offers some advantages in certain applications, the $B_0$ field is orthogonal to the face of the magnet, excluding the use of a simple surface coil to generate $B_1$. Specially designed planar coils must be used, resulting in a decrease in sensitivity.

Many other designs exist wherein the position of magnets in an array is modified in order to achieve some desirable characteristic in the topology of $B_0$. The common feature of these designs is that all deal with a forward problem: given a particular magnet array, determine the resulting $B_0$ field and subsequently determine how this field topology can be applied to achieve experimental goals. There is a need therefore, for an NMR sensor and method to address the inverse problem: given an experimental goal, select an appropriate $B_0$ topology and synthesize a design for an instrument providing this field.

Methods of simulating the $B_0$ field due to a given arrangement of magnets exist. One such example is the Finite Element (FEM) approximation. Designs can be optimized by performing successive simulations while varying parameters to minimize some goal function and this technique has previously been employed in unilateral magnet design. The drawback of this approach is that specific parameters (eg. size, position and strength of magnets) must be selected for the optimization and the parameter space must be empirically selected to suit the desired magnet topology. Furthermore, conventional simulation techniques are computationally expensive, leading to long optimization times, and constraining the number of parameters that can be optimized.

The use of high permeability material is standard in the design of closed permanent magnet NMR systems, where high permeability 'pole pieces' are used to control $B_0$ between the magnets. Many methods of shaping the pole pieces to provide an optimal $B_0$ topology have been proposed, however all deal with generating a homogeneous field between two magnets and cannot be directly applied to the unilateral case. Glover et al. have presented a permanent magnet based 1-D profiling system in which pole pieces, shaped according to contours of magnetic scalar potential, were used to give a desired static field (see P. M. Glover, P. S. Aptaker, J. R. Bowler, E. Ciampi, P. J. McDonald, A novel high-gradient permanent magnet for the profiling of planar films and coatings, J. Magn. Res., 139 (1999) 90-97). This approach is attractive in that it offers a low complexity method of configuring magnets and pole pieces to control $B_0$ but the profiling system in Glover et al. is a closed magnet assembly.

SUMMARY

According to one aspect of the present invention, there is provided: a magnetic field generator apparatus suitable for use in unilateral nuclear magnetic resonance, the magnetic field generator generating a field in a region of interest, the magnetic field generator comprising: at least one magnet having a pole; the width of the at least one magnet at the pole substantially coinciding with the distance between two portions of a first contour line of a magnetic field potential obtained by solution to Laplace's equation, the magnet positioned relative to the region of interest so that the width of the at least one magnet coincides with the two portions of the first contour line; whereby the field generated by the at least one magnet in the region of interest substantially matches with the gradient of the magnetic field potential.

According to another aspect of the present invention, there is provided: a method of making a magnetic field generator apparatus suitable for use in unilateral nuclear magnetic resonance, the magnetic field generator generating a field in a region of interest, the magnetic field generator comprising: (a) providing a pre-determined design requirement including a pre-determined field requirement within the region of interest; (b) determining a magnetic field potential by solution to Laplace's equation given the pre-determined design requirement; (c) determining a first contour line of the magnetic field potential; (d) providing at least one magnet having a pole; the width of the at least one magnet at the pole substantially coinciding with the distance between two portions of the first contour line; and (e) positioning the magnet relative to the region of interest so that the width of the at least one magnet coincides with the two portions of the first contour line; whereby the field generated in the region of interest by the at least one magnet substantially matches with the gradient of the magnetic field potential.

According to yet another aspect of the present invention, there is provided: a method of making a magnetic pole piece suitable for use in combination with a magnet array to provide a magnetic pole piece assembly, the magnetic pole piece assembly suitable for use in magnetic resonance imaging (MRI) applications, the method comprising the steps of: (a) providing a pre-determined design requirement including a pre-determined region of interest (ROI) design requirement having a pre-determined volume requirement and a pre-determined position requirement, and a pre-determined magnetic field gradient strength requirement over the pre-determined volume of the ROI; (b) expressing an approximation of a magnetic field by using a finite number of summation operations of summands wherein the summands include a finite number of coefficients; (c) expressing approximate derivative of the approximation of a magnetic field in terms which include the finite number of coefficients; (d) relating at least one of the approximation of a magnetic field and the approximate derivative of the approximation of a magnetic field to the pre-determined design requirements so as to obtain a finite number of equations relating the finite number of coefficients to the pre-determined design requirements; (e) determining the finite number of coefficients using the finite number of equations and the pre-determined design requirements; (f) determining a field potential using the finite number of coefficients and the pre-determined design requirements; and (g) forming a pole piece whose surface coincides with at least one contour of the determined field potential.

An approach for designing single-sided magnets suitable for unilateral magnetic resonance (UMR) measurements is presented. The method uses metal pole pieces to shape the field from permanent magnets in a target region. The pole pieces are shaped according to solutions to Laplace's equation, and can be designed using a combination of analytical methods and numerical optimization. The design leads to analytical expressions for the pole piece shape and magnetic field. The method is developed in Cartesian, polar, and spherical coordinates, and the merits of each system are discussed. The effects of finite magnet size on the field quality are explored through simulation, and are found to have a substantial effect in many cases. A magnet is designed using our method to produce a static field with a constant gradient over a region 2 cm in diameter and 2 mm thick. This leads to a compact cylindrical magnet just over 11 cm in diameter, topped with a single metal pole piece. The design is validated through simulation. The simulated field is found to agree closely with that specified analytically through the design procedure.

We have described a method of shaping a magnetic field in a region remote from the magnet, used for designing UMR apparatuses. The method has been developed in three different coordinate systems and the merits of each discussed. Cartesian coordinates are conceptually simple, and best suited to large or closed magnet arrays as they imply periodic boundary conditions. Polar coordinates give better correspondence between the designed field and that which can be physically realized, for a long magnet array. This system is fitting for an array with a sensitive spot which is long in one direction. Spherical coordinates give the best control over the field, as evidenced by the agreement in FIG. 23 and are most appropriate for designs requiring a circular, axially symmetric spot.

It has been shown that for a 2D design, the length of the magnets in the third dimension plays a crucial role in the field quality. This result applies to any magnet arrays designed in 2D. Using the design procedure developed in this work, a magnet has been designed to give a field with a constant gradient in a 2 cm diameter external region. Comparison of simulation results with the design specifications indicates close agreement, validating the technique. By designing the magnet in 3D, no assumptions regarding the length of the assembly were required, leading to a compact design. The design ideas discussed here can be broadly applied to build magnet arrangements with a field profile tailor made for specific applications.

Other aspects and features of the present invention will become apparent to those ordinarily skilled in the art upon review of the following description of specific embodiments of a magnetic field generator suitable for unilateral nuclear magnetic resonance and method for making same in conjunction with the accompanying drawing figures.

BRIEF DESCRIPTION OF THE DRAWINGS

Embodiments of the present invention will now be described, by way of example only, with reference to the accompanying drawing figures, wherein.

Like reference numerals are used in different figures to denote similar elements.

DETAILED DESCRIPTION OF THE DRAWINGS

Figure 3:
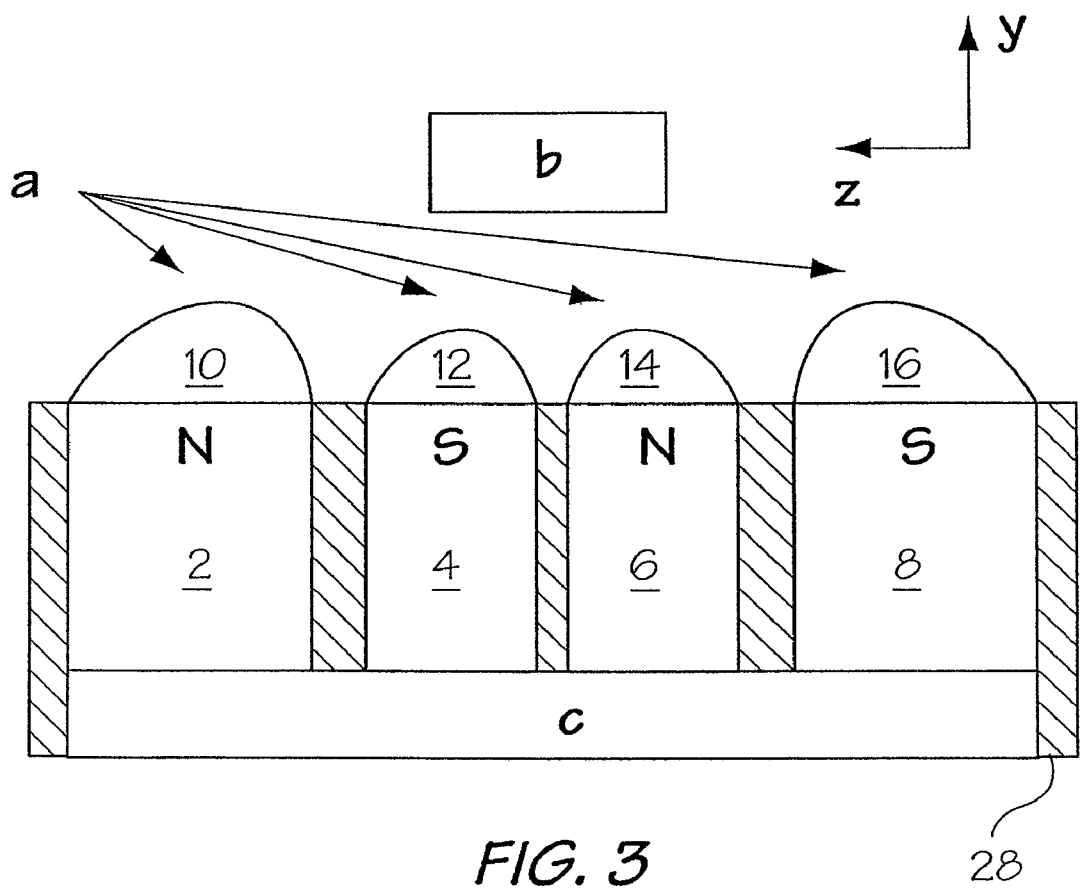
FIG. 3 is a diagram of a fabricated array according to the invention.

Referring to FIG. 3, a unilateral NMR sensor is comprised of a planar array of permanent magnets 2, 4, 6 and 8 fitted with pole pieces 10, 12, 14 and 16 of high permeability material. The magnets 2, 4, 6 and 8 are mounted on a ferromagnetic yoke (c) in an aluminum frame 28. Pole pieces are an interface between a high strength permanent magnet and air (an air-pole interface). A pole piece is a section of material with a high magnetic permeability used to shape a magnetic field. The exact value of the magnetic permeability is not important but must be much larger than unity; this ensures that any magnetic field at the boundary between the pole piece and air is directed normal to the pole piece surface. With the field perpendicular to the pole piece surface, the surface can be treated as a contour of constant magnetic scalar potential. This allows the magnetic field above the pole pieces to be calculated.

Different high permeability ferromagnetic alloys may be used for the pole pieces. Preferably, the main requirements for the materials for the pole pieces are (1) high (>100) relative permeability; (2) a saturation magnetization higher than the desired magnetic field strength, although in other embodiments, the pole pieces can be partially saturated.

A static magnetic field vector, $\vec{B}$, can be described in terms of a magnetic scalar potential, $\phi$, as $$\vec{B} = \nabla \phi. \tag{1}$$

Since magnetic fields do not diverge, the divergence of Eq. (1) gives Laplace's equation, $$\nabla^2 \phi = 0 \tag{2}$$

the solution of which is well known. The air-pole piece interface indicated generally at "a" in FIG. 3, can be analyzed as having a constant magnetic scalar potential. Magnetic scalar potential is denoted by 0 and by definition, satisfies Laplace's equation.

The methods of the present invention, when used for creating a two-dimensional design, use contours of $\phi$ in a two-dimensional space, preferably, the z-y plane, extended along the x-axis, and thus only the two dimensional solution to Laplace's equation is considered. In two dimensions, by writing $\phi$ as the product of two one dimensional functions, the following particular solution is selected:

$$\phi(z,y) = e^{-ay}[b\cos(az) + c\sin(az)] \tag{3}$$

where a, b, and c are arbitrary constants. Because the Laplacian operation is linear, a linear combination of solutions of the form of Eq. (3) will also satisfy Eq. (2). For our application, it is desired that the magnetic field be parallel to the plane of the magnet array. It follows that the magnetic potential should be an odd function with respect to the center of the array, allowing the field to curl from one side to the other. Accordingly, b is set to zero and $\phi$ is written as:

$$\phi(z, y) = \sum_{i=0}^{N-1} e^{-a_i y} c_i \sin(a_i z) \tag{4}$$

It will be understood that the b coefficient will not always be set to zero depending on the particular NMR application. The magnetic field due to the potential described by Eq. (4) can be calculated using Eq. (1), resulting in $$\vec{B} = \frac{\partial \phi}{\partial z}\hat{z} + \frac{\partial \phi}{\partial y}\hat{y} \tag{5}$$

$$= \sum_{i=0}^{N-1} a_i c_i e^{-a_i y} [\cos(a_i z)\hat{z} - \sin(a_i z)\hat{y}].$$

For an $N^{th}$ order design, the parameter vectors $A=[a_0\ a_1\ \ldots\ a_{N-1}]$ and $C=[c_0\ c_1\ \ldots\ c_{N-1}]$ can be selected to approximate a desired $\vec{B}$ over a region of interest (ROI). Sample calculations and finite element simulations have shown that larger values of N will result in better control of $\vec{B}$, at the cost of design complexity.

Following methods taught by Glover et al., supra, and incorporated herein by reference, the surface of a high permeability ($\mu_r \gg 1$), linear, isotropic material can be approximated as an equipotential contour of $\phi$. Thus, a potential described by Eq. (4) can be realized using pole pieces shaped according to the contours of $\phi$=constant, mounted on permanent magnets of an appropriately chosen strength. This design method defines a family of magnet arrays suitable for unilateral NMR applications. The two-dimensional designs can be realized in three dimensions by making the magnets and pole caps sufficiently long in the x-direction such that edge effects are not present over the center of the array. Several approximations are used in the design method of the present design. The effects of the finite length of the array in the x-direction have been neglected. This is common practice in unilateral NMR magnet design although its ramifications are rarely discussed in the literature. The analytical design also assumes that $\phi$ is periodic in the z-direction. In an embodiment of the invention, the scalar potential becomes truncated due to the finite size of the magnet array. Simulations have indicated that $B_0$ can be controlled for y and z close to the array in a design of finite size.

Figure 1:
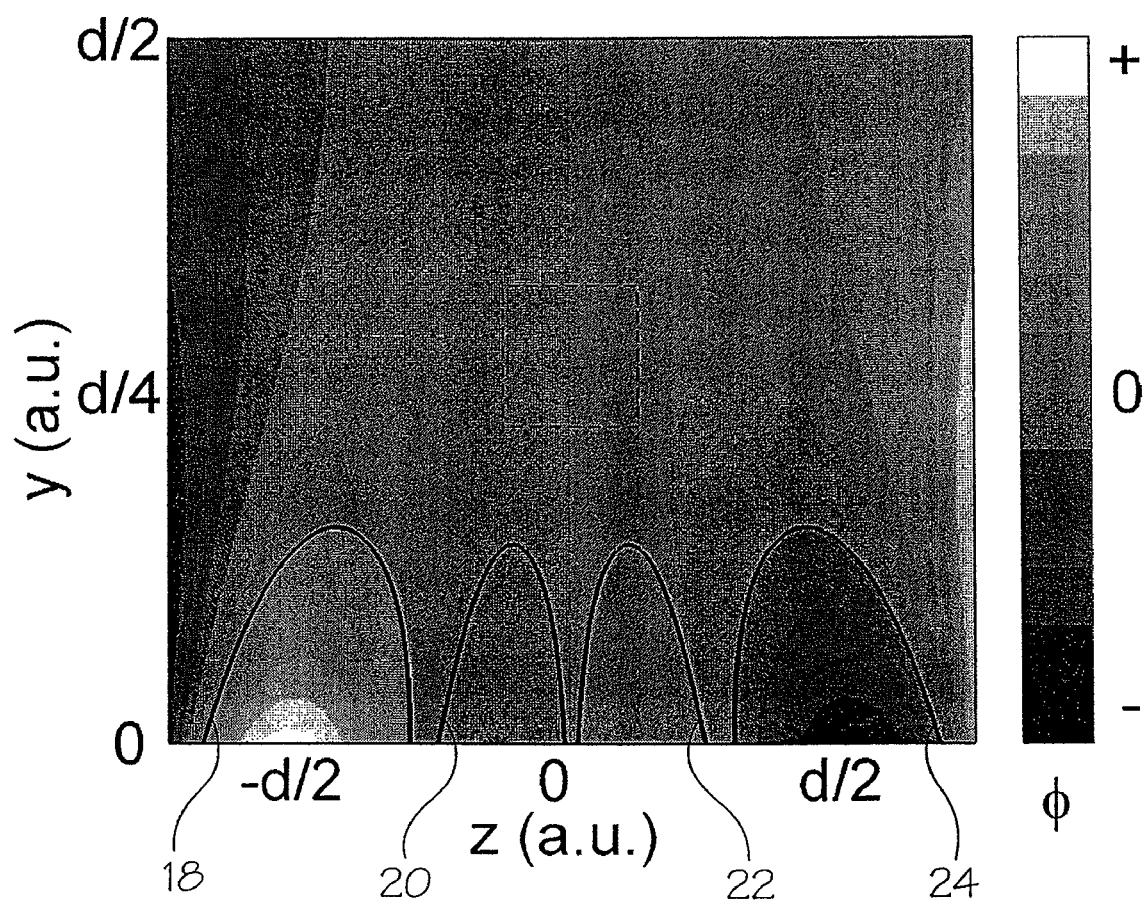
FIG. 1 is 1 is a contour plot of the optimized magnetic scalar potential for a design of an NMR sensor according to the invention, given by Eq. (4)

In a preferred embodiment of the invention, the method of determining the shape of the pole pieces for a magnetic array to achieve a desired magnetic field topology for a target region comprises the steps set out below:

In two dimensions, a solution to equation (2) is $$\phi(z, y) = \sum_{n=1}^{N} e^{-a_n y} [b_n \cos(a_n z) + c_n \sin(a_n z)] \quad (3)$$

where $a_n$, $b_n$, and $c_n$ are arbitrary constants. The corresponding magnetic field above the pole pieces is obtained by taking the gradient of this potential. This magnetic field can be controlled according to the following steps:

A target region in a two-dimensional plane, such as the z-y plane in FIG. 1, is defined, along with a corresponding target magnetic field topology for the region. For example, it could be desired that the field variation within the region is within a certain tolerance.

(ii) The array design is centered around the origin. In order to control the principal direction of the magnetic field, one of the sine/cosine terms in the desired potential is set to zero for all n. Even symmetry (including the cosine term) in the potential will give a field principally directed perpendicular to the surface of the magnet array with the flux return path leading towards the underside of the array. Odd symmetry (including the sine term) gives a field that curls from one side of the array to the other causing it to be principally directed parallel to the array over the center of the design.

(iii) The order N of the design is selected. This is done iteratively as a higher order will allow finer control of the magnetic field but will also increase the complexity of the design. Typically, the orders selected will be between 2 and 6.

(iv) The spatial frequencies, $a_n$ are selected. Typically, $a_1$ is chosen such that one full period ($2\pi/a_1$) is equal to the desired width of the magnet array, and higher frequencies are given by $a_n = na_1$. In this way, all spatial frequencies present in the design represent an orthogonal set, similar to a Fourier series.

(v) The coefficients ($b_n$ or $c_n$) are determined in order to minimize the difference between the desired and actual magnetic fields in the target region. These parameters can, for example, be varied systematically using nonlinear optimization techniques. In this stage, the order can be adjusted as necessary to give the desired accuracy.

(vi) The coefficients determined in steps (iv) and (v) specify a scalar potential that will give the desired magnetic field. By examining a contour plot of this potential, appropriate contours can be selected to be used as the shapes of the pole pieces. FIG. 1 shows a shaded contour plot of an example scalar potential distribution. Contours 18, 20, 22 and 24 selected for pole pieces are highlighted with thick lines. The selected contours must all be below the minimum y-value in the target field region, also referred to as the target sensitive volume indicated by the dashed box 26, ensuring the array can be used with arbitrarily sized samples. Within this constraint, the contours should be as close to the sensitive volume as possible in order to maximize the strength of the magnetic field and reduce field variations that can occur further from the pole pieces due to the finite size of the magnet array.

A bottom plane (y-value) must be selected to define the bottom of the pole pieces, where the magnets are located. In FIG. 1, this plane is simply y=0. In a physically realizable design, appropriate contours of $\phi$ will intersect twice with this plane, defining the size and position of one or more pole pieces. Contours should be selected such that the surface of the array will be covered fully by the pole pieces, with small gaps left only to aid in the positioning of the magnets. If at this stage it is determined that the design is not physically realizable, the order or target field may be adjusted.

Contours need not be of the same magnitude. Positive and negative contours lead to magnets oriented in opposite senses. For example, a positive contour could correspond to a magnet with its north pole below the pole piece.

(vii) The magnet array, including both magnets and pole pieces, is simulated in 2D in order to determine realistic values for the magnetic field strength. Magnets are selected to be of the same width as the pole pieces above them (see FIG. 3). As a guideline, magnet strengths should be chosen in proportion to the different magnitudes of the chosen scalar potential contours, however these can be varied to adapt the design to available magnet strengths.

(viii) The contours which define the shapes of the pole pieces in two dimensions are used to construct 3D pieces by extending them in the third dimension.

Figure 4:
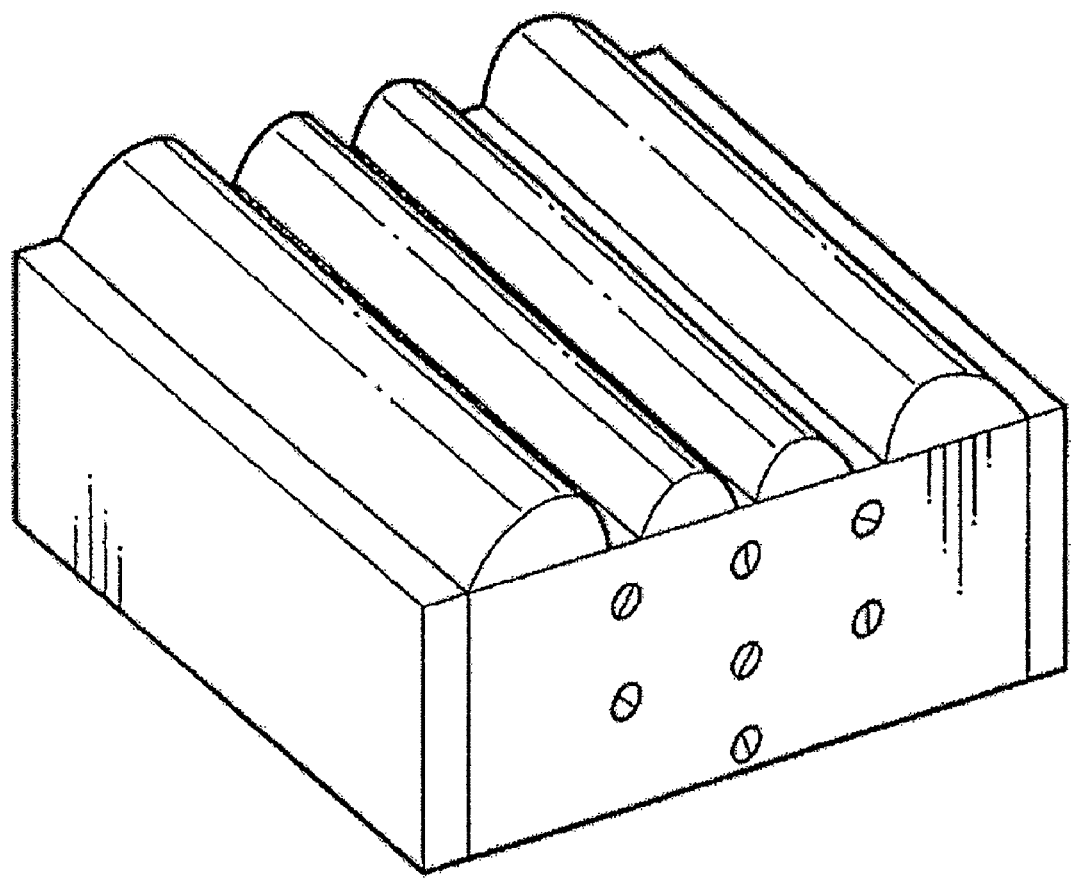
FIG. 4 is a photograph of the constructed array of FIG. 3.

FIG. 4 is a photograph of a magnetic array according to the invention designed using the method of steps (i) to (viii). In the array of FIG. 4, the magnets are Nickel plated N48. The yoke (not shown) is iron, and the frame 26 is aluminum.

In the embodiment discussed above, equipotential contours of scalar potential are selected in two dimensions whereby only the two dimensional projection of an air-pole interface is a contour of scalar potential.

The methods of the invention can by adapted to three dimensional designs for magnetic arrays.

Example 1

The method described above was used to design a magnetic array for unilateral sensor for the detection of moisture ingress into graphite/aluminum/epoxy composite sandwich panels. The primary design goals for this magnet array were: (1) a large sensitive volume to combat the poor SNR inherent in this sample; (2) a low resonant frequency to mitigate interactions between $B_1$ and the conductors in this structure.

From Eq. (3), it is clear that any units of length can be chosen for the array design, and thus the magnet array can be designed in arbitrary units and scaled to a desired size as appropriate. In this example, the solution space has a width of approximately d units. The ROI is 0.275d units above the plane of the magnets and centered over the array. It is 0.25d units in width and 0.1d units in height. Within the ROI, it is desired that $|\vec{B}|$, the modulus of $\vec{B}$, should be constant, giving a constant resonant frequency, $\omega_0$, inside this volume. In order to achieve the desired field within $$\min_{A,C} \int\int_{ROI} (|B| - |\overline{B}|)^2 dz dy,$$

the ROI, a cost function was developed. In this example, the deviation of $|B|$ from its mean value over the ROI was minimized. The resulting design goal can be represented mathematically by (6) where $|\overline{B}|$ is the average modulus of $\vec{B}$ over the ROI. Although this was the minimization criteria used, it suffers the notable disadvantage of having the trivial solutions $a_i=0$ and $c_i=0$, necessitating that $a_0$ and $c_0$ be fixed. However, there are advantages in fixing $a_0$ and fixing $c_0$ will simply have a scaling effect on the solution. Thus Eq. (6) is equivalent to evaluating $$\min_{A,C} \int\int_{ROI} (|B| - D)^2 dz dy,$$

for some constant D. The exact function to be minimized is dependent on the desired field configuration. For example, if it was desired that B had no y-component and a constant gradient, G, in the y-direction centered about $y_0$, the minimization problem could be $$\min_{A,C} \int\int_{ROI} [(B_z - (D + G(y - y_0)))^2 + (B_y - 0)^2] dz dy.$$

The cost function given in Eq. (6) was evaluated to determine the optimal parameters for N=3. This order was selected as a compromise between accurate control of $B_0$ and complexity of the resulting magnet array. In order to better define the problem, values were selected for the parameter vector A. The terms, $a_i$ are arguments of the sine function in Eq. (4) and thus represent spatial frequencies present in the scalar potential. It thus makes sense to include frequencies describing large scale variations across the array geometry, as well as higher frequencies describing local detail within the pole caps. Accordingly, $a_0$ is selected to correspond to a 'fundamental' frequency, $a_0=2\pi/d$. In this example, subsequent values of $a_i$ were set to $a_1=(4/3)\pi/d$ and $a_2=\pi/d$. These three frequencies cover a relatively narrow range of detail in the shape of the pole pieces and were selected as a compromise between design complexity and accurate approximation of the desired field. In principle, these values need not be specified and appropriate parameters will arise naturally as a result of the optimization. In this case, it would have been necessary to modify the goal function in order to ensure that the optimal $\phi$ could be realized with a unilateral design.

With A set, the optimal value of C was determined by minimizing the cost function over a discrete solution space using the Matlab optimization toolbox. The parameter $c_0$ was fixed in order to avoid a trivial solution in the optimization. FIG. 1 shows a contour plot of the scalar potential resulting from the optimization of the remaining parameters. The ROI is indicated by the dashed box 26. The thick solid lines 18, 20, 22 and 24 represent the contour lines selected as pole pieces. The selected contours are as close to the ROI as possible as the magnetic field will always decay rapidly with distance from the magnets. The magnitude of $\phi$ for the inner two contours is $\frac{1}{7}$ the magnitude for the outer contours. The sign of $\phi$ alternates between positive and negative for each of the poles. It is important to note that the number of pole pieces was not specified in order to achieve the design. The shape of the contours is solely the result of minimizing Eq. (6) with the constraints discussed.

Figure 2:
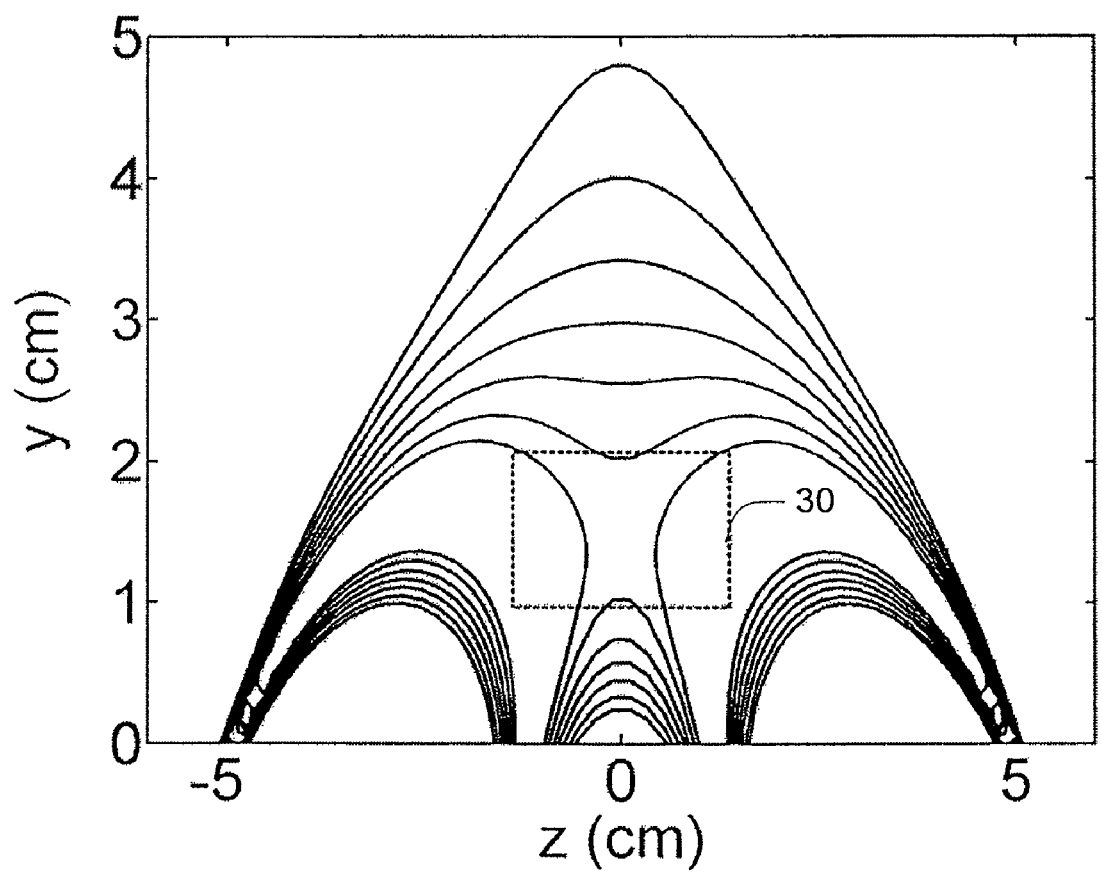
FIG. 2 is a contour plot of the z-component of the theoretical magnetic field for a design, determined analytically as the gradient of the scalar potential field shown in FIG. 1.

Taking the gradient of $\phi$ gives the magnetic field strength, B. FIG. 2 shows a contour plot of the x-component of the field, $B_x$, due to the scalar potential depicted in FIG. 1. The target sensitive volume is denoted by the dashed box 30. The position, y=0, corresponds to the surface of the inner pole pieces. The field contours represent an 8% change in the magnetic field strength. The actual field strength is dependent on the strengths of the magnets used in the construction. It is observed that there is a saddle point at the center of the target sensitive volume.

In FIG. 2, the solution has been scaled such that the distance between the opposite edges of the outer pole caps is 15 cm (6"). The contours are given in percent as the absolute field strength will depend on the strength magnets used in the design. It is observed that the spatial variation of $B_x$ within the ROI is at a minimum. At the center of the ROI, the field gradient is zero. In the calculated solution, $B_x$, increases in magnitude as y increases. This occurs because the calculation assumes that $\phi$ can be controlled everywhere. In a practical implementation, $B_0$ must always eventually fall off with distance from the magnets. However, near the array, the shape of $B_0$ is readily controlled using the pole caps.

Using the contours shown in FIG. 1, a four-magnet array was constructed. The geometry of the array is depicted in FIG. 3. The pole pieces 10, 12, 14 and 16 rest over the permanent magnets 2, 4, 6 and 8, whose relative field directions (North/South) are indicated by "N" and "S" respectively in FIG. 3. The target sensitive volume is highlighted by the box (b). The area (c) is an iron yoke, used to concentrate and contain the magnetic field on the bottom of the array. The hatched area represents the aluminum structure 28 used to house the magnets. The pole pieces are bolted to the aluminum 28 at either end as shown in FIG. 4. The outer magnets were 5 cm (2") in height and 4 cm (1.7") in width, while the inner magnets were 2.5 cm (1") wide. The entire array was 15 cm (6") wide, and was made to be 15 cm (6") long in the x-direction.

The magnets were housed in an aluminium frame with an iron yoke concentrating the field at the bottom of the array. In order to safely place the magnets in the frame, 0.95 cm (⅜") holes were drilled through the yoke under the slot for each magnet. The holes were tapped allowing nonmagnetic threaded rod to be fed through them. A guiding structure was then built to fit over the frame, allowing each magnet to be inserted in turn away from the others. By turning the threaded rod back out of the frame, the magnets were slowly lowered into position in a controlled manner.

The pole pieces were machined from high permeability steel using a 3-axis ES-V4020 CNC vertical machining center. Threaded holes were drilled in the flat face of the pole pieces, allowing them to be bolted up through the aluminum frame. Nonmagnetic brass screws were used in all aspects of the construction. FIG. 4 shows a photograph of the array. The yoke (not visible) is attached below the magnets (not shown). The pole pieces are machined from high permeability steel. The four NdFeB magnets are housed under the pole pieces. Each has a surface field strength of 0.5 T.

Design Validation

In order to compensate for the differences between the analytical design and the manufactured array, the array was simulated using the FEMLAB finite element simulation software. Magnetic fields in y-z plane were evaluated assuming the array was infinite in the x-direction.

Figure 5:
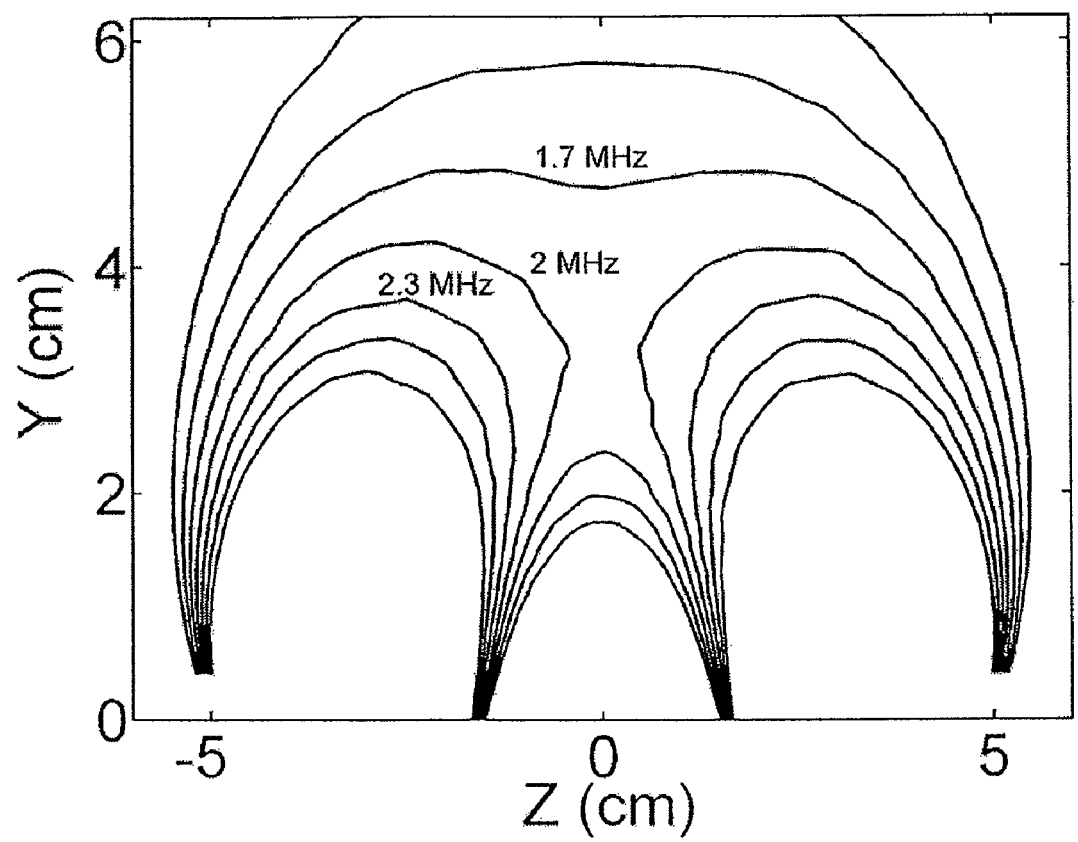
FIG. 5 is a simulated magnetic field ($B_z$) contour plot for the array of FIG. 3.

FIG. 5 shows a simulated contour plot of the z-component of $B_0$. The field strength is expressed as contours of the resonant frequency for $^1H$ according to Larmor equations. The position y=0 corresponds to the upper surface of the inner pair of pole pieces. Only the z-component is presented as this is the main component of $B_0$ and is readily compared to measurements from the fabricated array using a 1-axis gaussmeter. The shape of the simulated field is clearly similar to that predicted by the analytical expression. The saddle point in the magnetic field strength is again present over the center of the array, however it is displaced in the y-direction due to differences between the magnets used in fabrication and those specified in the design. At large (y,z), the field topology deviates from its predicted shape because of the finite dimensions of the array.

It is immediately apparent that the simulation results agree with the analytically determined field topology presented in FIG. 2. The saddle point in the field is present but is displaced due to changes in the relative strengths of the magnets. For large values of y and z, there is a deviation between the analytical and simulated results as the analytical results assume that $\phi$ can be controlled everywhere.

Figure 6:
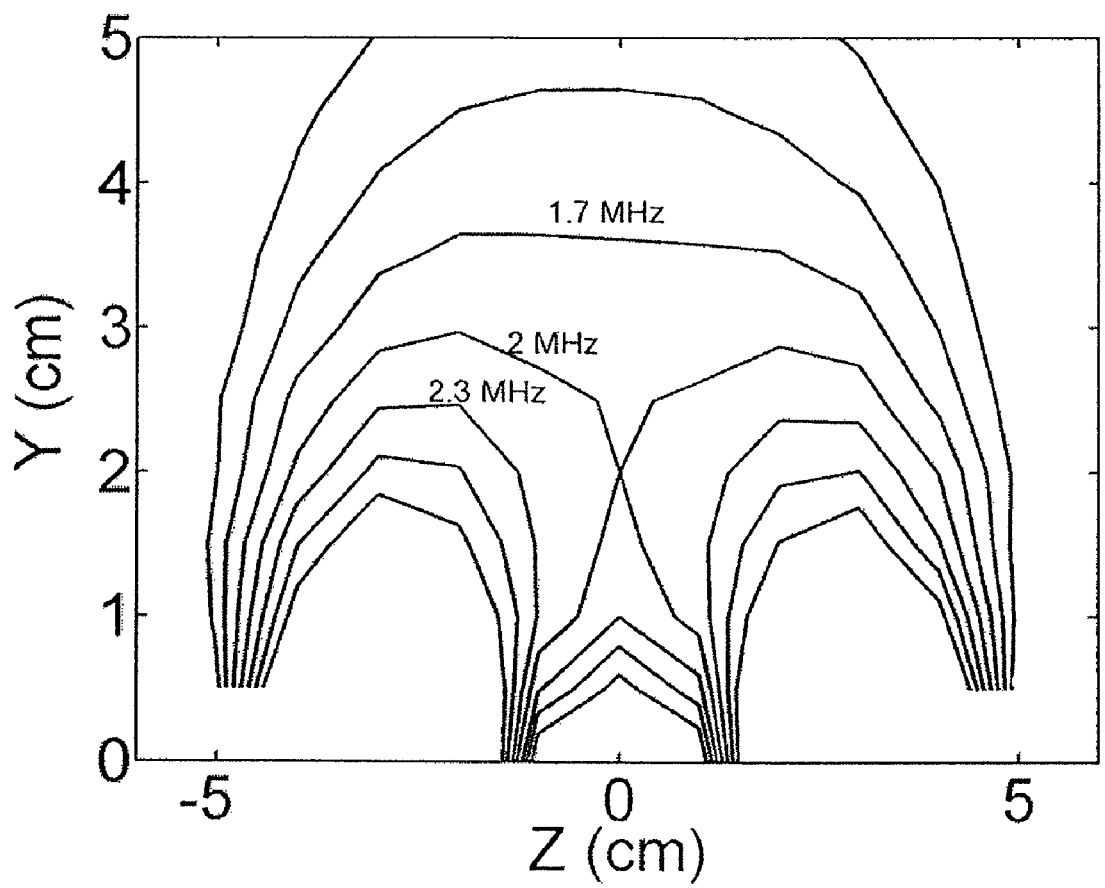
FIG. 6 is a measured magnetic field contour plot for the array of FIG. 3.

Using a Lakeshore 450 1-axis gaussmeter, the z-component of the magnetic field from the fabricated array was measured over the center of the x-dimension of the magnets on a 1 cm grid. A plot of the measured magnetic field, presented as $^1H$ frequency contours, is shown in FIG. 6 shows that the overall distribution of field lines in the plot is consistent with that presented for the simulated array. The field contours are labeled in MHz for $^1H$ magnetic resonance according to the Larmor equation. The result is in congruence with the simulated result in FIG. 4. The distance, y, is measured from the upper surface of the inner set of pole pieces. The observed shift in the position of the sensitive volume is attributed to differences between the fabricated and simulated magnets and pole pieces, along with inaccuracies in the field measurement introduced by errors in the position and orientation of the hall sensor. The sensitive volume is indicated by the saddle point in the plot. It is ~1.5 cm in width and ~1.5 cm in height and is centered about 2 cm up from the inner pole pieces. There is a slight difference between the position of the sensitive spot in the measured and simulated results. This systematic difference is attributed to the combined effects of differences between the actual and simulated magnetic fields for the magnets, along with a small change in the height of the manufactured pole pieces, introduced to facilitate their fabrication.

Experimental Results

Several sample NMR measurements using a prototype array according to the invention were tested. In each case, the resonant frequency was 2.01 MHz and a 10 turn, capacitively coupled, 2 cm diameter surface coil positioned above the array was used for the measurements. The coil quality factor was approximately 27. The size of the surface coil limits the size of the sensitive volume in the x-direction, while the dimensions of the homogeneous region of $B_0$ limit the volume in the y-z plane.

NMR Signal Characteristics

Figure 7:
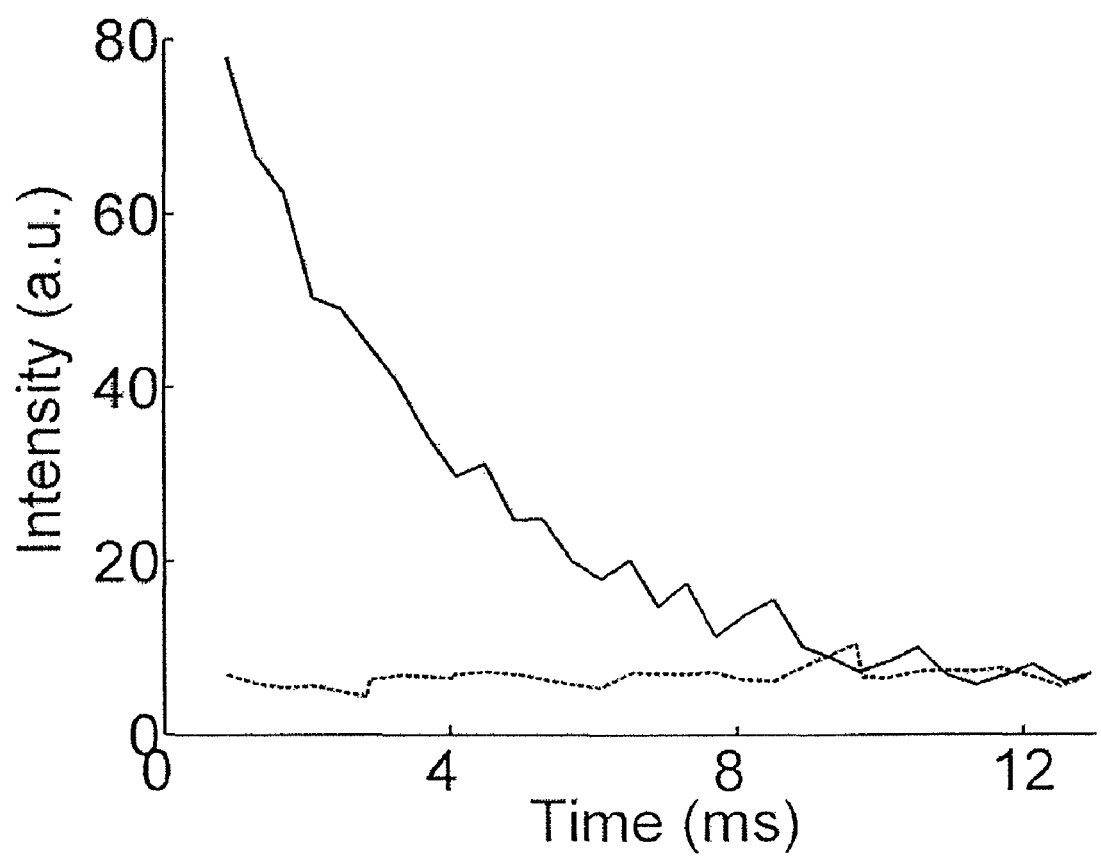
FIG. 7 is an observed CPMG decay (solid line) for a polyisoprene rubber sample measured at 2.01 MHz with the fabricated array of FIG. 3.

FIG. 7 shows a test measurement made with the array. The solid line represents the peak magnitudes for the first 32 echoes in a phase cycled CPMG sequence using a polyisoprene rubber sample larger than the sensitive volume selected by the coil. The dashed line represents the noise level for the system. It is observed that there is a large amount of noise present in the acquisition. This is attributed to the open design of the array along with the low acquisition frequency. The echo time was 0.4 ms. 32 echoes were acquired with 512 averages. A nominal 90° degree pulse length of 2 µs, along with a corresponding 180° degree pulse of 4 µs was used in the acquisition. The observed decay constant was $T_{2eff}$=3.3 ms. The $T_2$ of the polyisoprene sample was 1.4 ms at 8.3 MHz. Differences between these values are attributed to the change in $B_0$ strength, as well as a slight spin locking effect brought on by the inhomogeneous field and short echo time. The dashed line shows the noise level in a measurement made with no sample present. The observed noise in the measurement is high due to the low frequency and open design of the array.

Figure 8:
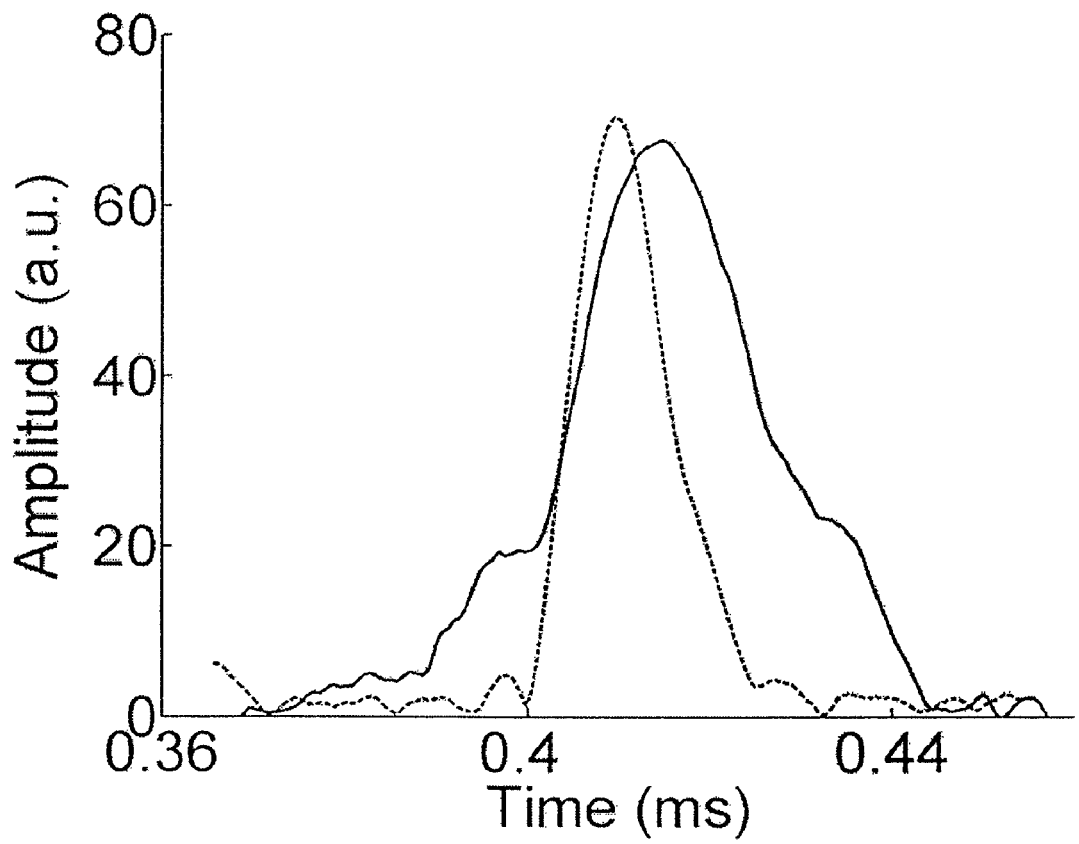
FIG. 8 is a comparison between spin echoes observed using the array of FIG. 3; at 2.01 MHz (solid line) and a commercial unilateral NMR sensor at 14.85 MHz (dashed line)

FIG. 8 compares single echoes acquired with a α-τ-2α-z pulse sequence. The solid line shows an echo acquired from a polyisoprene sample using the prototype array while the dotted line shows an echo acquired from the same sample using a commercial MOUSE system operating at 14.85 MHz using a 1 cm diameter, one turn surface coil with a quality factor of approximately 80. For the commercial system, the size of the sensitive volume was completely limited by the homogeneity of $B_0$, rather than the geometry of the RF coil. The nominal 90° and 180° pulse widths for the array measurement were 2 µs and 4 µs respectively. For the MOUSE measurement, the pulse width was fixed at 6 µs and the amplitude was adjusted to achieve the appropriate flip angles. All other experimental parameters for both measurements were identical.

It is observed that both echoes shown in FIG. 8 have comparable SNR levels. This indicates that the increase in the size of the sensitive volume resulting from the controlled $B_0$ field in the array, along with the coil design, compensates for any SNR disadvantages due to the lower operating frequency. It is expected that optimization of the coil design would result in a substantial increase in SNR.

The echo observed from the array is also much broader than that from the MOUSE. The observed $T_2^*$ is on the order of 10's of µs, indicating broadband excitation from the short RF pulse. In a strongly inhomogeneous static field, the observed signal lifetime is approximately equal to the duration of the RF pulse due to the wide range of precession frequencies of the excited spins. This is true for the MOUSE measurement, however despite the shorter pulses used with our array, the signal lifetime is much longer. The 'shoulders' observed on the echo from our array have been observed elsewhere in measurements and simulation at comparable magnetic field strengths and homogeneities.

Both measurements were made on a polyisoprene sample larger than the sensitive volume of the devices. The echo time was 0.4 ms and 512 scans were used. Both measurements exhibit comparable SNRs, despite the factor of 33 disadvantage inherent in our sensor due to the lower $B_0$. The echo for the prototype array is broader than that for the commercial instrument, although the excitation bandwidth is broader.

Field Inhomogeneity Measurement

Figure 9:
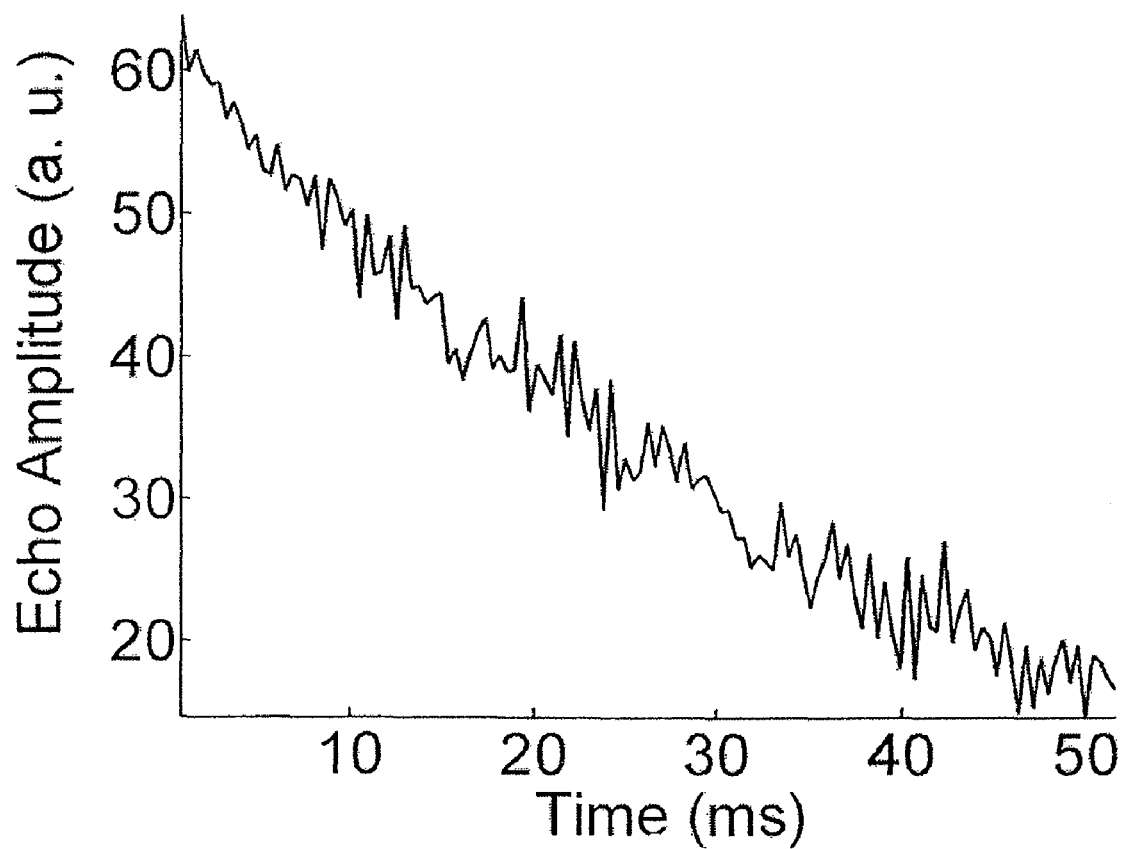
FIG. 9 is a CPMG measurement of a liquid sample using the array of FIG. 3.

Measurements on diffusive samples were made in order to quantitatively assess the homogeneity of the $B_0$ field for the prototype array. Using a doped water sample larger than the instrument sensitive volume, the effects of diffusive attenuation on a CPMG measurement were examined for the array. A CPMG decay for this sample obtained with the array is presented in FIG. 9. The sample was a bottle of doped water ($T_2$=36.2 ms at 8.3 MHz) much larger than the sensitive volume of the device. The echo time was 0.4 ms and 512 scans were averaged. The observed relaxation constant was 45 ms, indicating that the effects of diffusion were negligible. A signal lifetime of <2 ms was observed for the same measurement using a commercial unilateral NMR sensor. The discrepancy between the observed relaxation constant and the sample $T_2$ results from a combination of spin-locking effects and the difference in frequency.

The observed decay constant is 45 ms, in agreement with the sample $T_2$, indicating that diffusive attenuation has a negligible effect on this measurement. Identical measurements made with the commercial unilateral sensor showed a decay constant of 1.3 ms, clearly the result of diffusive attenuation brought on by the strong gradient associated with this device. While this is desirable in some applications, the advantage in observing fast-diffusing systems will be understood. The observed decay constants for the doped water and the polyisoprene sample were slightly longer than the sample $T_2$ values measured at 8.3 MHz. This is attributed to the contribution of $T_{1\rho}$, the sample spin-lock relaxation constant, and $T_i$, the spin lattice relaxation time, due to the inhomogeneity of $B_0$ [24]. Furthermore, the difference in frequency could have an effect on the sample $T_2$. Since diffusive attenuation is irreversible, the effects of $T_{1\rho}$ and $T_1$ do not enter in to comparisons concerning this effect. The decreased sensitivity to diffusion exhibited by the prototype represents a tremendous advantage in measuring rapidly diffusing samples, and alludes to the homogeneity of $B_0$.

In order to quantify this homogeneity, the effects of diffusive attenuation on the signal from a distilled water sample larger than the sensitive volume were measured using the array while the echo time was varied. Assuming that the sample has a $T_2$ that is much longer than the decay constant due to diffusion, the observed decay constant for a CPMG measurement is given by:

$$\frac{1}{T_{2\textit{eff}}} = \frac{\gamma^2 D}{3} G^2 \tau^2 \quad (7)$$

Figure 10:
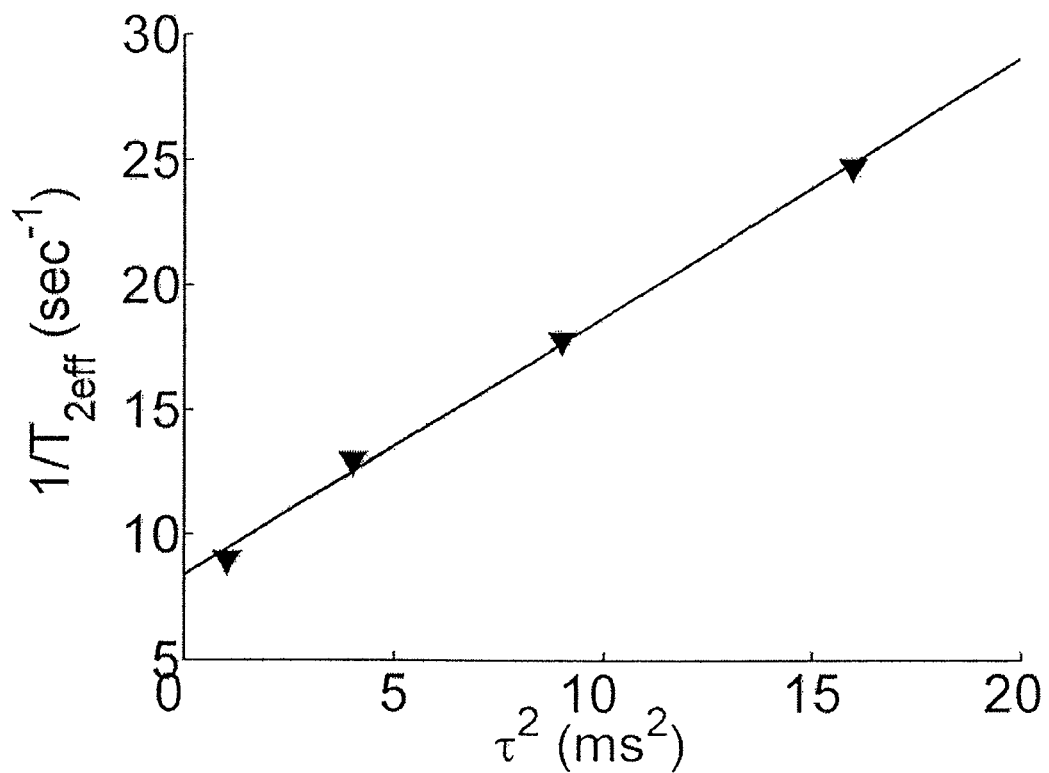
FIG. 10 is a plot of the inverse of the observed decay constant against the echo time squared for a series of CPMG measurements made using the array of FIG. 3 and at various echo times for a distilled water sample.

Varying $\tau$ and plotting the inverse of the effective decay constant against $\tau^2$ results in a straight line with a slope related to the gradient, G, in $B_0$. FIG. 10 shows such a plot measured using the array for $\tau$ values between 1 ms and 4 ms. The slope of the line is $1.03 \times 10^6$ s$^3$. Assuming the diffusion constant of distilled water to be $2.51 \times 10^{-9}$ m$^2$/s at room temperature, the calculated gradient is 0.13 T/m.

Moisture Detection in Composite Panels

The object behind the development of this prototype was the detection of moisture within composite sandwich panels. It will be understood, however, that this is but one potential application for the invention. Because of the difficulties associated with this type of sample, measurements using conventional unilateral NMR devices have previously yielded unacceptable results. In order to validate the prototype array, measurements were made of a representative composite test sample. The sample consisted of a 4 cm×4 cm sandwich panel, 16 mm in thickness. The panel had an anodized aluminum honeycomb core sandwiched between graphite epoxy composite skins. Ten central cells of the honeycomb lattice were partially filled with a total of ~2 mL of doped water. The goal of the moisture detection was to see a clear NMR signal from the water within the cells despite the shielding effects of the graphite skin and aluminum core.

Figure 11:
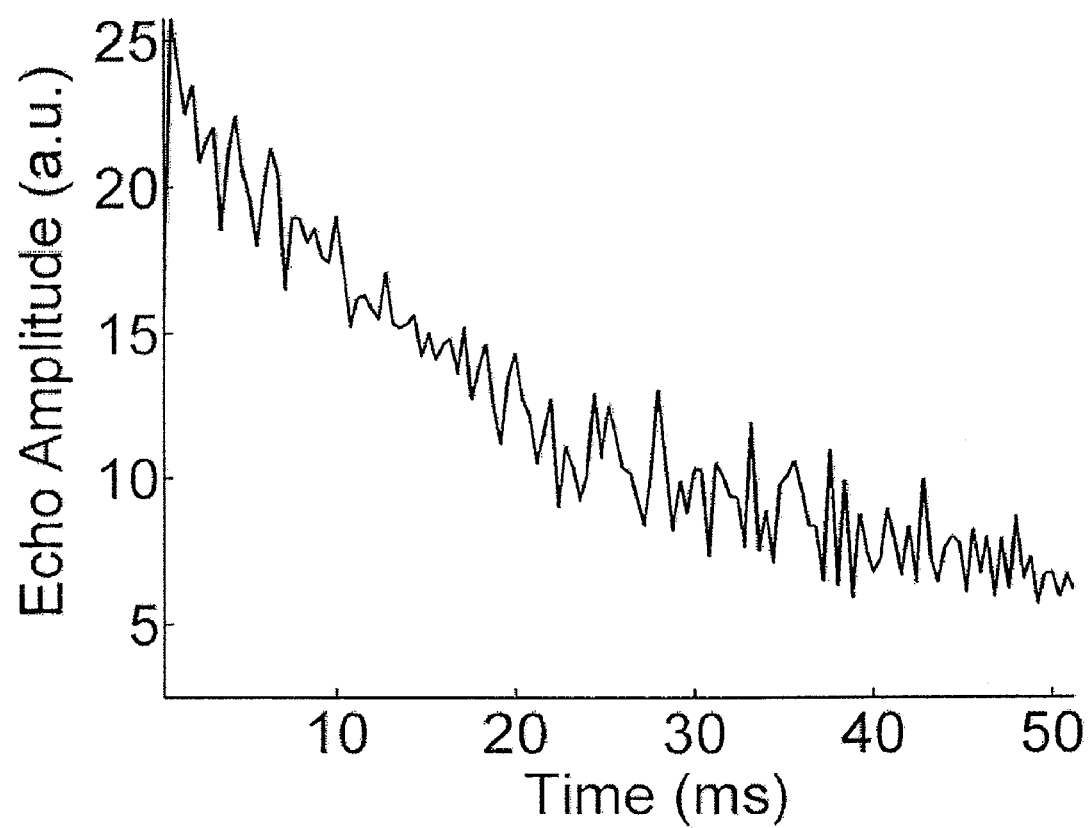
FIG. 11 is a CPMG measurement of water inside of a representative sample of aluminum/epoxy/graphite composite.

FIG. 11 shows the signal observed from the water with the prototype array. Ten cells inside of a 4 cm×4 cm composite sample were filled with approximately 2 mL (total) doped water for this measurement. The prototype, with an echo time of 0.4 ms and 512 scans, yields a strong and readily interpretable result. This is attributed to the larger sensitive volume, a better field homogeneity and the lower RF frequency, allowing better $B_1$ penetration through the conductive skin. The CPMG decay is both strong and relatively long lived. This is a combination of the larger sensitive spot and better field homogeneity of the array, as well as the lower frequency of the RF field. The low frequency of this prototype permits RF penetration of the graphite skin. This results in a successful measurement which was not possible with the commercial MOUSE due to its higher frequency of operation.

Experimental Details

Optimization of Eq. (5) used the Nelder-Mead simplex method (see J. A. Nelder, R. Mead, A simplex method for function minimization, The Computer Journal, 7 (1965) 308-31), implemented in the Matlab (The Mathworks, Natick, Mass.) software package. Finite element simulations used the FEMLAB (Comsol, Burlington, Mass.) package. The relative magnetic permeability of the NdFeB magnets was assumed to be 1.05; that of the iron yoke, as well as that of the pole pieces was assumed to be 100. The permeability of the aluminum frame was not considered. The simulation used 14,483 mesh nodes.

The magnetic arrays of the present invention can by used with commercially available unilateral NMR systems such as a Bruker (Rheinstetten, Germany) MOUSE, driven by a Minispec mq Series console running Minispec V2.41 software. The resonant frequency was 14.85 MHz, resulting in the selection of a ~5 mm×5 mm×~1 mm sensitive volume displaced 5 mm from the surface of the MOUSE. The RF amplifier was rated for 300 Watts. A Bruker surface coil was used for all measurements except the sandwich panel. The nominal pulse width of 6 μs was selected by varying the pulse width to maximize the echo amplitude in a spin echo measurement. For the sandwich panel measurements, a homebuilt 1 cm diameter 2 turn inductively coupled surface coil with a resonant frequency of 15.0 MHz was used with the MOUSE. The optimal pulse width was 11 μs.

The low $^1$H frequency for the prototype array precluded the use of the Bruker console alone for acquisition. The Bruker Minispec software and pulse programming hardware were used, however the Minispec amplifier was replaced with an Amplifier Research (Bothell, Wash.) 200 L 300 W broadband amplifer. A preamplifier built around a Miteq (Hauppauge, N.Y.) RF amplifier was used in detection. The amplifier did not allow amplitude control to be programmed and thus different 90° and 180° pulse lengths were required. Pulse lengths of 2 μs and 4 μs respectively were selected by maximizing the amplitude of an observed spin echo. For the sandwich panel measurements, these values were modified to 3 μs and 6 μs. All measurements used a 10 turn 2 cm diameter capacitively coupled surface coil. The resonant frequency was 2.01 MHz.

The doped water samples used Gadolinium Chloride as the doping agent and had a measured $T_2$ of 36.2 ms at 8.3 MHz. The polyisoprene sample had a measured $T_2$ of 1.3 ms at 8.3 MHz. These measurements were performed in the homogeneous magnetic field of a permanent magnet system with a 14 cm pole gap.

Planar Magnet Arrays

In another embodiment of the invention, analytical linear algebra methods are used in place of numerical optimization methods to define the magnet sizes and pole shapes and in particular, the coefficients (a) and (c) in equation (3).

In another embodiment of the invention, the scalar potential design method according to the invention can be used to yield an array design with the pole pieces omitted but which retains the rational control of $B_0$.

A permanent magnet has an associated scalar potential in its own right. By appropriately combining the scalar potential functions associated with an array of magnets with arbitrarily sizes and shapes, it is possible to have a measure of control over $B_0$ simply based on the magnet characteristics. The omission of pole pieces is advantageous in that it reduces the complexity of the design in some cases.

A comparison between the scalar potentials and associated magnetic fields for a magnet array both with and without pole pieces is given below. For the case considered, the scalar potential contours due to the magnets are similar to those defining the pole pieces, allowing a similar magnetic field to be obtained from the magnets alone. The new magnet array was designed for the purpose of in-situ nondestructive testing of aerospace composites. Results show that the array can be used to rapidly detect small quantities of water within a graphite/aluminum panel.

Design Method

In two dimensions, an arbitrary scalar potential, $\phi(z-y)$ will satisfy $$\phi(z, y) = \sum_{n=1}^{N} e^{-a_n y}[b_n \cos(a_n z) + c_n \sin(a_n z)] \quad (8)$$

Preserving only the sine term (odd symmetry), the associated magnetic field, $B = \sigma\phi$, is $$B = \sum_{n=1}^{N} a_n c_n e^{-a_n y}[\cos(a_n z)\hat{z} - \sin(a_n z)\hat{y}]. \quad (9)$$

With $a_n = na$, at the z-origin, the field as a function of y is $$|B(0, y)| = \sum_{n=1}^{N} m_n e^{-nay} \quad (10)$$

where $m_n = nac_n$. The $i^{th}$ derivative of Eq (3) is $$|B(0, y)|^{(i)} = \sum_{n=1}^{N} (-1)^i (na)^i m_n e^{-nay}. \quad (11)$$

Consider a desired magnetic field, $B_0$, with a gradient, G, about some point, y=d. Writing out the first i derivatives of Eq (3) and setting N=i+1 gives, in matrix form, $$\begin{bmatrix} e^{-ad} & e^{-2ad} & \cdots & e^{-Nad} \\ -ae^{-ad} & -2e^{-2ad} & \cdots & e-Ne^{-Nad} \\ \vdots & \vdots & \ddots & \vdots \\ (-1)^i(a)^i e^{-ad} & (-1)^i(2a)^i e^{-2ad} & \cdots & (-1)^i(Na)^i e^{-Nad} \end{bmatrix} \quad (12)$$

$$\begin{bmatrix} m_1 \\ m_2 \\ \vdots \\ m_n \end{bmatrix} = \begin{bmatrix} B_0 \\ G_y \\ \vdots \\ 0 \end{bmatrix}.$$

Simplifying Eq (5) to AM=B, the m coefficients which give the desired field are determined through a simple matrix inversion:

$$M = A^{-1}B. \quad (13)$$

Array Design and Construction

Using a method according to the invention, an array was designed to have a field gradient of zero (saddle point) at a position 4.5 cm above the face of the magnets. The design uses only two c parameters in Eq. (8). The design here is similar to the array shown in FIG. 4 but uses a slightly larger array. Comparison with the array of FIG. 4 indicates that for this case, the numerical optimization yields a result similar to the new method.

Figure 12A:
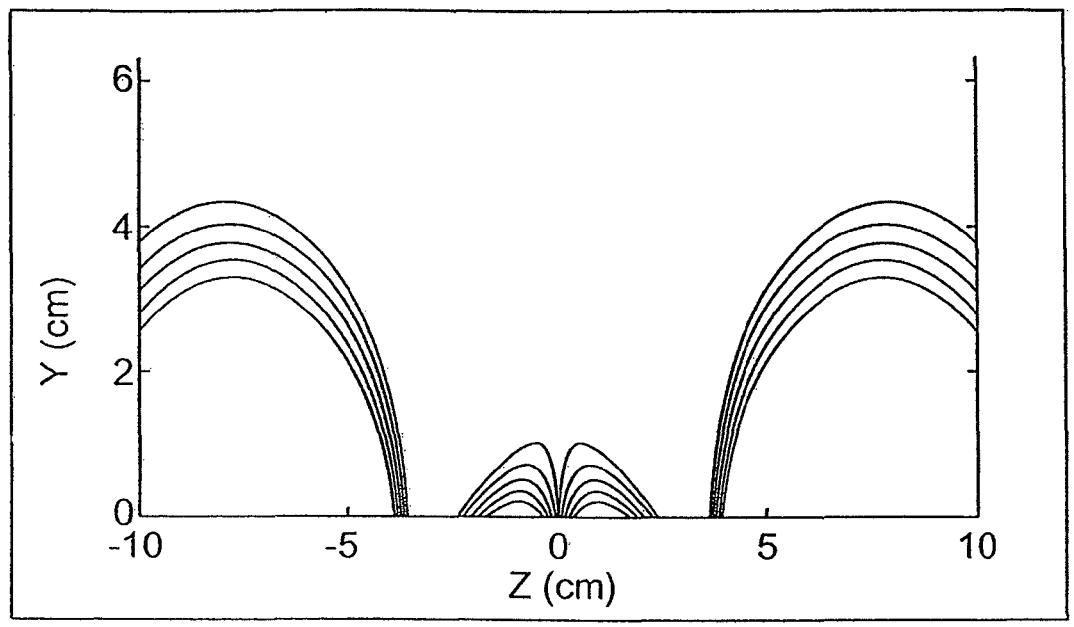
FIG. 12(a) illustrates a selection of scalar potential contours provided by an optimization method according to the invention.
Figure 12B:
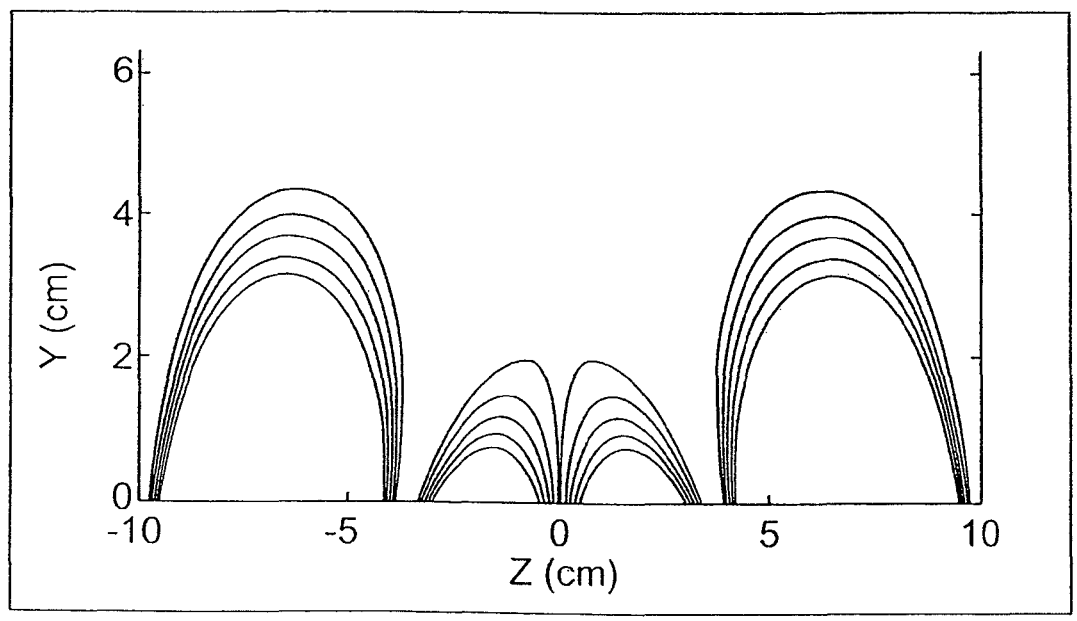
FIG. 12(b) shows analogous scalar potential contours from the array of four magnets specified by the design of FIG. 12(a)

FIG. 12 (a) illustrates a selection of scalar potential contours provided by the optimization that may be used as the shape of the high permeability pole pieces. The intersection of the contours with the y-origin defines the number and size of the magnets, while the relative magnitudes define the magnet strengths.

FIG. 12 (b) shows analogous scalar potential contours from the array of four magnets specified by the design, calculated without the pole pieces. While the contours are clearly different, the general trend is the same. From Eq. (9), small scale properties of $B_0$, associated with higher spatial frequencies, will decay at a faster rate with distance from the array. For this reason, in some cases, a large scale trend in the shape of the scalar potential is all that is required to give the same approximate field.

Figure 13:
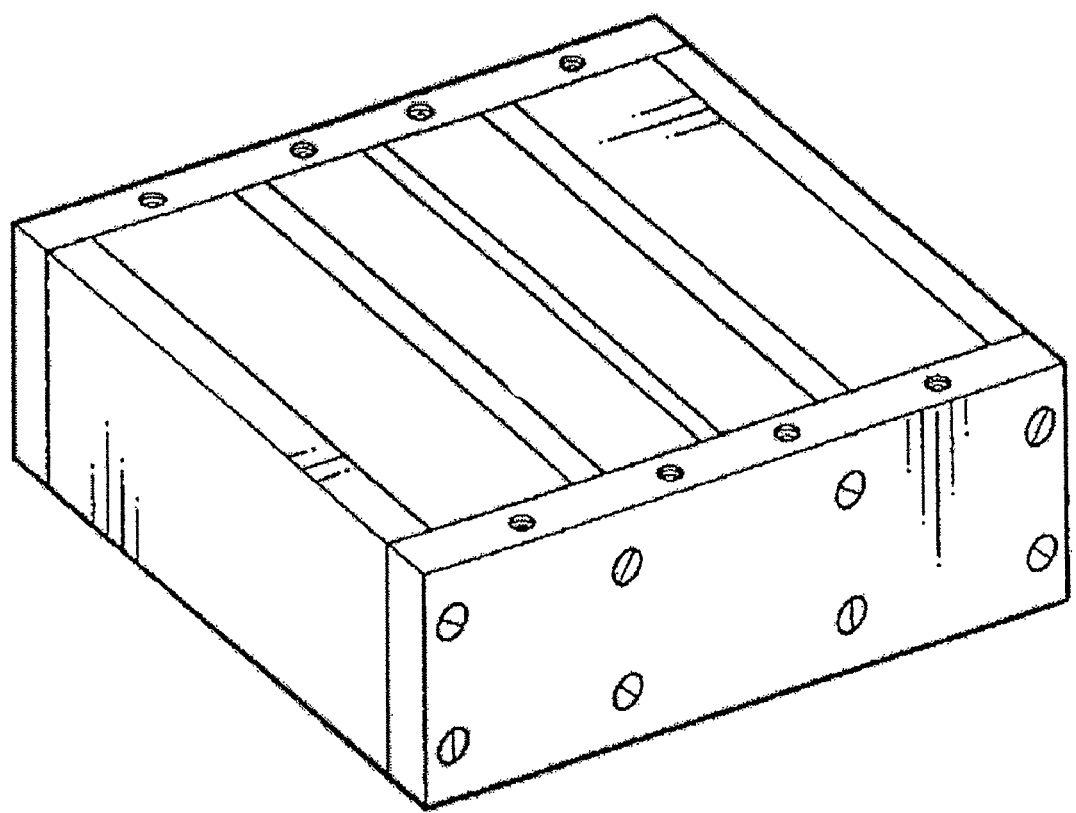
FIG. 13 is a photograph of a magnet array according to the invention, built without pole pieces.
Figure 14:
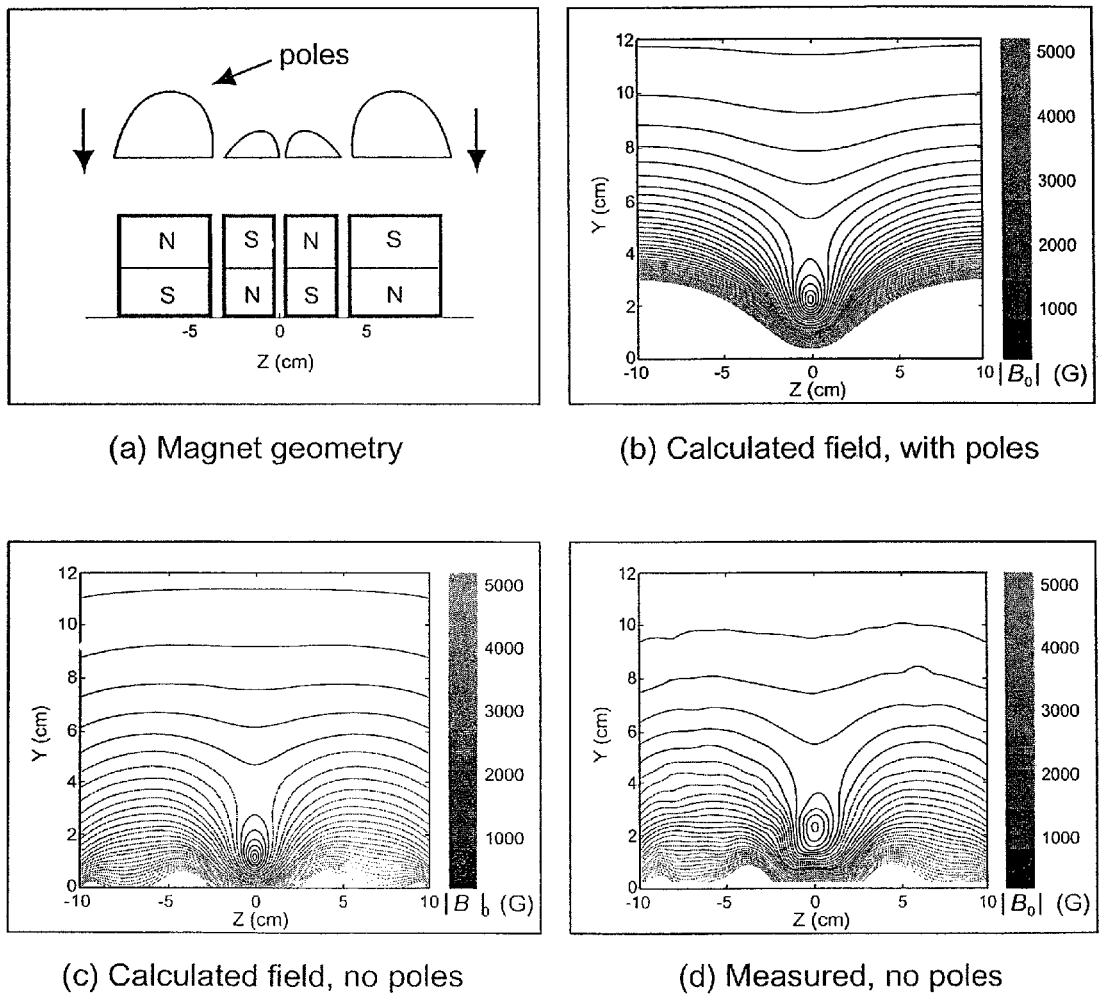
FIG. 14a is a magnet array according to the invention.
FIG. 14b is a contour plot of the calculated field, with poles.
FIG. 14c is a contour plot of the calculated field, without poles.
FIG. 14d is the measured field, without poles.

FIG. 13 is a photograph of the magnet array, built without pole pieces. The magnets are NdFeB, with a 1006/1008 steel yoke joining them on the underside. The orientation of the magnets, along with the shape of the poles is shown in FIG. 14 (a). A contour plot of the calculated field with the pole pieces in place is shown in plot 14(b), while 14(c) illustrates the field calculated without the poles. As expected, near the array the fields are very different, however in the vicinity of the saddle point, they are quite similar. For the case of the planar array, the saddle point is slightly closer to the magnets. While all plots here have been normalized, the field would also be stronger with the pole pieces in place. The field from the array, constructed without the pole pieces, was measured—FIG. 14(d)—to confirm the calculations. The agreement is close, and it was found that the frequency at the center of the saddle point was approximately 3.5 MHz. If this low field is acceptable for the application, the pole pieces are clearly not necessary.

It is important to point out that foregoing the pole pieces will not be an option for all magnet geometries. If the sensitive spot was closer to the array, or the shape of the pole pieces is more complex, the results will not agree.

APPLICATION

The magnet array without pole pieces was designed for the purpose of nondestructive inspection of aerospace composites (graphite-aluminum honeycomb composites) used as control surfaces in modern, high-performance aircraft.

Moisture ingress into these composites has been linked to catastrophic failure, and magnetic resonance has been demonstrated to be promising for in-situ detection of water within the aluminum cells. In order to make UMR a viable detection technique, rapid, definitive detection of water is required. Because the water is sealed in a conductive panel, magnetic resonance measurements are inherently insensitive. The large, relatively uniform region of $B_0$ was designed into our array in order to make it more sensitive than previous UMR systems.

The measurements discussed above using the prototype array naming pole pieces according to the invention for detecting water for this application measured a simple CPMG decay. While detection was possible, the averaging required for a successful experiment made the measurement long. Following Casanova et al. (G. Guthausen, A. Guthausen, G. Balibanu, R. Eymael, K. Hailu, U. Schmitz, and B. Blümich, Soft-matter analysis by the NMR-MOUSE, Macromal. Mater. Eng. 276/277 (2000) 25-37, and incorporated herein by reference) in another embodiment of the invention, a multi-echo averaging scheme to increase the acquisition speed was used. The echo time was 0.4 ms, and 128 echoes were averaged. An echo is visible after only one scan, and can be definitively detected within eight. This type of measurement would not be possible in the higher gradient associated with many UMR arrays, since the apparent signal lifetime would be severely limited by diffusive attenuation.

Grouse

Figure 15:
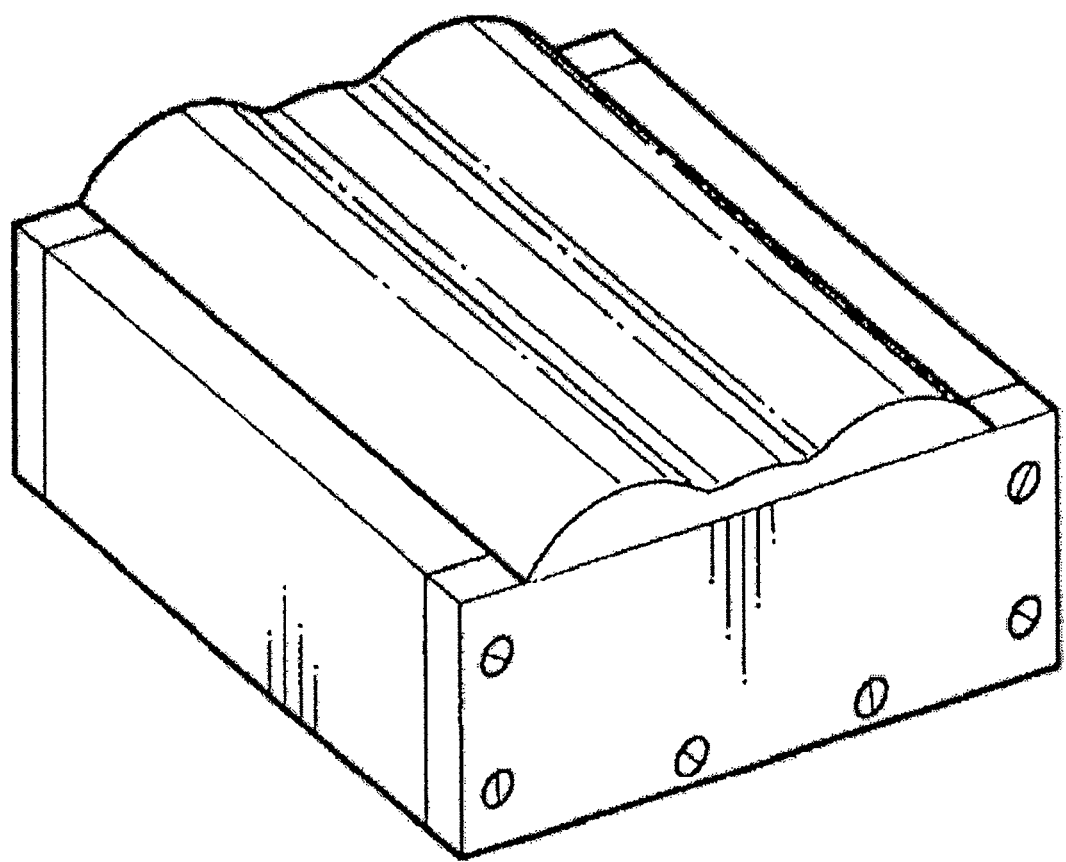
FIG. 15 is a photograph of a GROUSE magnet array according to the invention.
Figure 16:
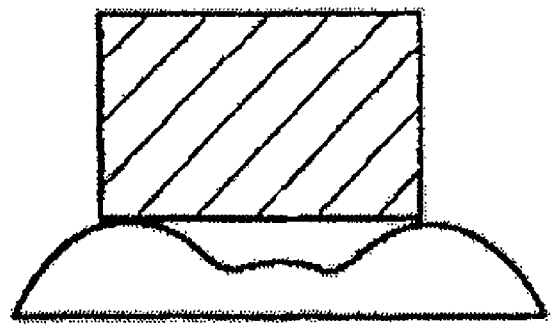
FIG. 16 is the side view of the pole piece of FIG. 15 with a sample.
Figure 17:
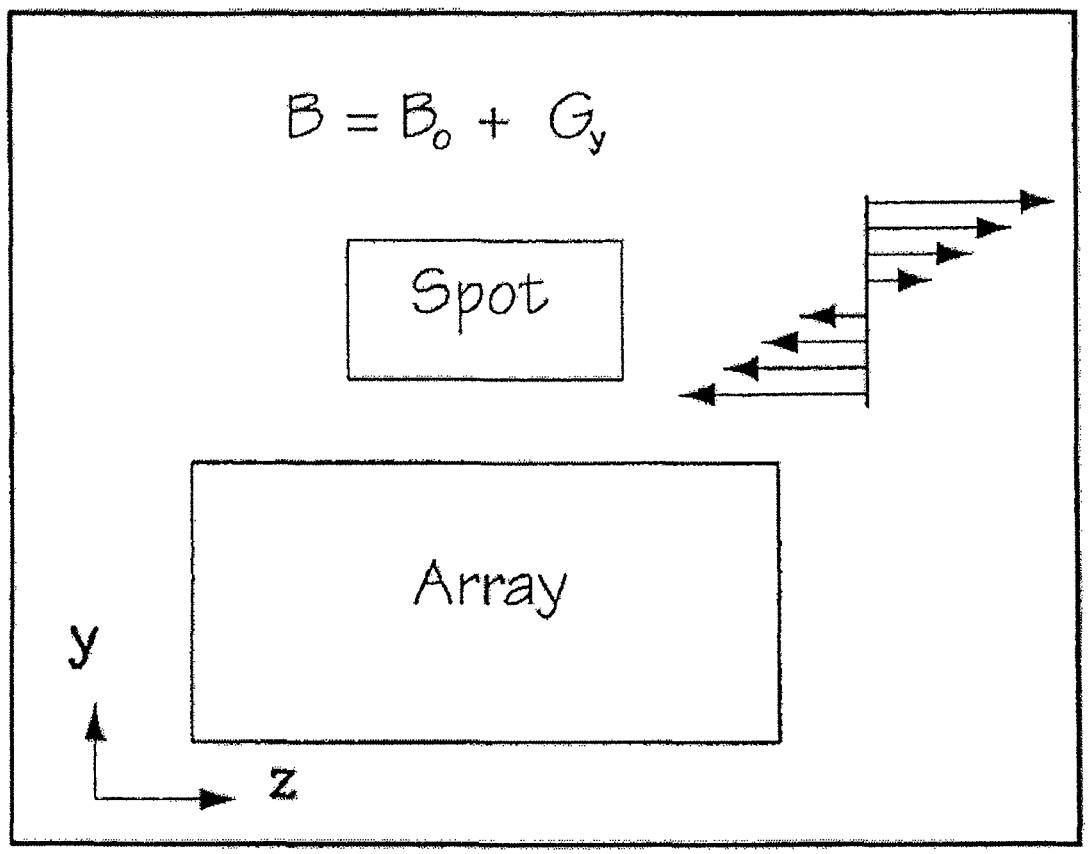
FIG. 17 is a schematic diagram of an array with a fixed linear gradient, according to the invention.

Another embodiment of a magnetic array according to the present invention is shown in FIG. 15 which includes a single but more complex pole piece (referred to as GROUSE). The pole piece used is shown in FIG. 16. Referring to FIG. 17, array has a "built in" or "fixed" linear y-direction field gradient and a spatially varying magnetic field which changes as one moves away from the magnet pole piece surface. There is a region of space where the variation of the magnetic field is linear with distance—this is the region of linear gradient. Since the gradient is linear, there is a direct connection between frequency and space, ie in this region a one-dimensional image, a profile, which is an accurate rendering of the test object can be generated. The GROUSE array can be designed using the methods previously described.

The pole piece shown in FIG. 16 can be used with a single magnet or an array of two or more magnets.

Since the magnetic field gradient is linear and can by used to generate profiles, profiles can be generated from restricted regions of space within the linear gradient (ie focus on sub sections of the profile). This is accomplished through band selective RF pulses which have a frequency selectivity, and by varying the length of the pulse, the width of the frequencies excited can by altered which in turn changes the 'width' of the object in the profile. For example, if the target region is the region of the crust in a french fry for a profile, band selective pulses can be used to generate a profile from only that region of interest.

Example

In the prototype GROUSE array shown in FIG. 16, the following design criteria was used:

$B_0$ normal to magnet surface;
Gradient, G=~30-50 Gauss/cm;
Sensitive Spot 2.5 cm above magnet, pole pieces must fit within this region; and
Gradient Linearity:

$$\left.\frac{\partial^2 \vec{B}_0}{\partial y^2}\right|_{y=2.5} = 0$$

It will be understood that the methods of the invention can be used to design and construct a variety of unilateral magnet arrays and families of arrays including (1) a single magnet and single pole piece, which forms a linear gradient through the sensitive spot, (2) a four magnet array with four pole pieces which has a uniform sensitive spot and (3) a four magnet array with a uniform sensitive spot which lacks pole pieces entirely.

General Solution to Scalar Potential in Cartesian Coordinates

Figure 18:
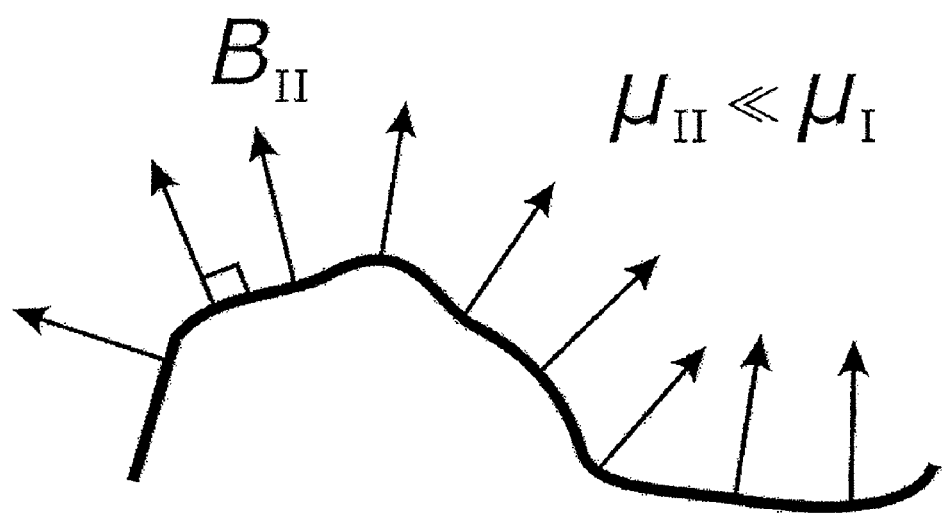
FIG. 18 illustrates the interface between a region (I) of high magnetic permeability $\mu_i$ and a region (II) of low permeability $\mu_{II}$.

Consider the interface illustrated in FIG. 18 between a region (I) of high magnetic permeability $\mu_I$ and a region (II) of low permeability $\mu_{II}$. At the boundary between the regions, Maxwell's equations constrain an incident magnetic field such that the tangential components of $\vec{H}$ must be equal (where $\vec{B}=\mu\vec{H}$ as usual). If $\mu_I$ is assumed to be much larger than $\mu_{II}$, this restriction means that the tangential field in region II must be zero and the field in this region will be perpendicular to the interface everywhere.

A static magnetic field can be represented as $$\vec{B} = \nabla\phi \quad (14)$$

where the scalar function $\phi$ is termed the magnetic scalar potential. Adopting this definition, a contour to which $\vec{B}$ is normal is evidently a line of constant $\phi$. Hence, the boundary in FIG. 1 is an equipotential contour of scalar potential. It is through this principal that a static field can be shaped as desired. To link the static field to the shape of a contour of $\phi$, we take the divergence of (14) giving $$\nabla \cdot \vec{B} = \nabla \cdot (\nabla\phi) = \nabla^2\phi = 0 \quad (15)$$

which is Laplace's Equation. Solutions to this equation are well known. We wish to find those solutions that decay with distance from the origin, in keeping with the decaying field solutions expected in a unilateral magnet. In Cartesian coordinates (x, y, z), this gives $$\phi_{xyz} = \sum_{n=1}^{N} e^{-nay}(b_n\cos(nax) + c_n\sin(nax)). \tag{16}$$

This function represents N independent solutions to (15) weighted by the arbitrary constants $b_n$ and $c_n$. The solution is periodic with period $2\pi/a$ in x and decays exponentially in y. It is assumed that the magnet to be constructed will be long enough in z that variation in this direction can be neglected and the design completed in 2D. This is a more general solution than the particular solution (3).

General Solution to Scalar Potential in Polar Coordinates

The solution to (15) in polar coordinates $(\rho,\psi,z)$ is $$\phi_{\rho\psi z} = \sum_{n=1}^{N} \rho^{-1}(b_n\cos(n\psi) + c_n\sin(n\psi)) \tag{17}$$

where again it is assumed that the variation in z can be neglected. In this solution, the potential is undefined at the origin but decays with $\rho$.

General Solution to Scalar Potential in Spherical Coordinates

Figure 19:
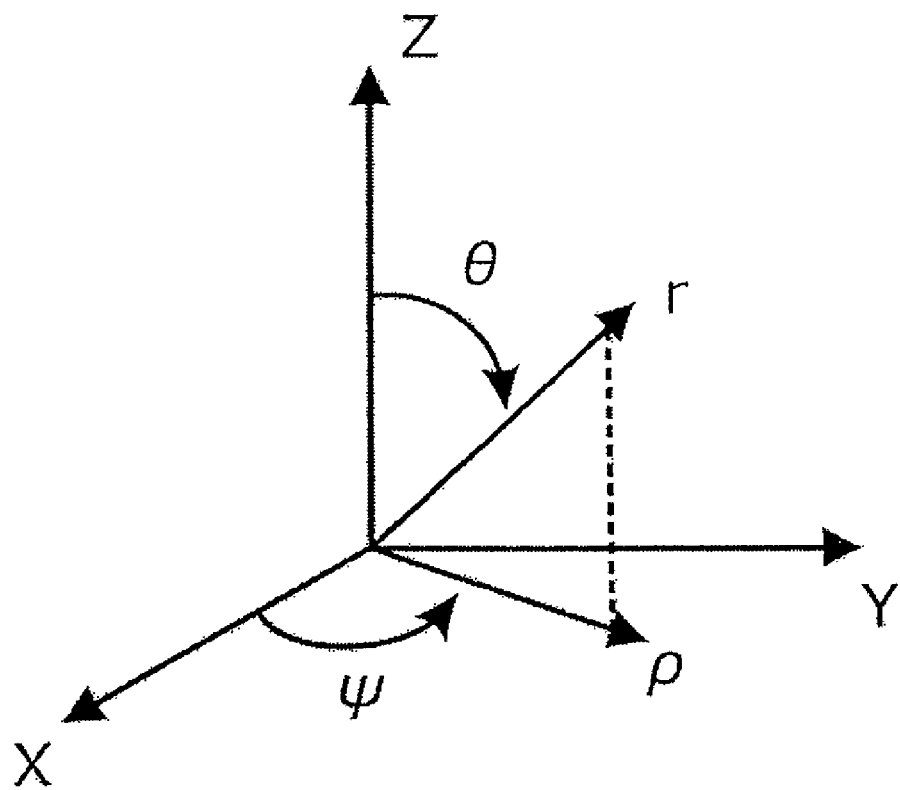
FIG. 19 illustrates coordinate axis relating three coordinate systems: cartesian, polar, and spherical.

In spherical coordinates $(r,\theta,\psi)$ the solution becomes $$\phi_{r\theta\psi} = \sum_{n=1}^{N}\sum_{m=0}^{n} [r^{-n-1}P_n^m(\cos\theta)\cdot(b_{nm}\sin(m\psi) + c_{nm}\cos(m\psi))] \tag{18}$$

where $P_n^m(\mu)$ is an associated Legendre polynomial. Although somewhat more complex, this solution makes no assumptions with regard to the spatial variation in any direction, and decays radially. A coordinate axis relating the three coordinate systems is given in FIG. 19. While in MR it is conventional to denote the principal direction of $B_0$ as $\hat{z}$, the coordinate axes used here are fixed to avoid confusion.

Each of the solutions (16)-(18) defines the scalar potential in terms of arbitrary constants. Through (14), the corresponding $\vec{B}$ can be determined and controlled in a region of interest by optimizing these constants. Subsequently, one or more contours of the optimal $\phi$ can be selected to define the shapes of high permeability pole pieces which will appropriately shape the field supplied by permanent magnets. The success of the design will depend on how closely the optimally determined scalar potential can be represented by discrete pole pieces. Practical aspects of pole piece selection will be discussed in greater detail below under the heading POLE PIECE CONTOUR SELECTION.

The Cartesian solution (16) was originally proposed for a magnet geometry which was closed on its sides (see P. M. Glover, P. S. Aptaker, J. R. Bowler, E. Ciampi, P. J. McDonald, "A novel high-gradient permanent magnet for the profiling of planar films and coatings," *J. Magn. Res.*, vol. 139, pp. 90-97, July 1999), lending itself to a periodic solution. Several unilateral designs have subsequently used this method with promising results (see A. E. Marble, I. V. Mastikhin, B. G. Colpitts, and B. J. Balcom, "An analytical methodology for magnetic field control in unilateral NMR," *J. Magn. Res.*, vol. 174, pp. 78-87, May 2005; and A. E. Marble, I. V. Mastikhin, B. G. Colpitts, and B. J. Balcom, "A constant gradient unilateral magnet for near-surface MRI profiling," *J. Magn. Res.*, submitted for publication). However, because the scalar potential function is periodic, the pole pieces and magnet array must be made large compared to the region of optimized $B_0$ in order to mitigate finite length effects. As a result, this solution has been found to lead to magnets large compared to their sensitive region. The approximation will inevitably result in discrepancies between the calculated field and that which is physically realized. This solution is, however, the simplest mathematically, a potential advantage in terms of field optimization.

The solution in polar coordinates lends itself more naturally to UMR designs, as the potential function decays with $\rho=\sqrt{x^2+y^2}$. If the summation in (17) begins at n=2, the associated magnetic field, at large distances from the magnet, will decay with $\rho^{-3}$ thus approximating a dipole. This is advantageous over the exponentially decaying solutions in (16) but still suffers from end effects due to the finite z-extent of a real design.

The spherical coordinate solution (18) can incorporate a truly 3D design, allowing tighter control over the field and significantly better agreement between the optimized $B_0$ and what can be physically realized. While in Cartesian coordinates, the period a of the array must either be specified as a design parameter or incorporated into the optimization, polar and spherical coordinates have the added advantage that the extent of the pole pieces naturally falls out of the design specifications. This is especially advantageous in spherical coordinates, where the length of the magnets does not need to be specified, leading to a more compact magnet design.

Optimization

In all cases, the free parameters in (16)-(18) can be optimized using a 'brute force' technique. In this case, an area or volume termed a region of interest (ROI) is specified and the parameters are varied using some nonlinear optimization routine. The problem then becomes $$\min_{b_n,c_n} \int_{ROI} (\nabla\phi - B_{TAR})^2 dv \tag{19}$$

where $B_{TAR}$ is a target magnetic field specified within the ROI and dv degenerates to a differential area element for the 2D case. This type of minimization has previously been accomplished using the Nelder-Mead simplex method (see A. E. Marble, I. V. Mastikhin, B. G. Colpitts, and B. J. Balcom, "An analytical methodology for magnetic field control in unilateral NMR," *J. Magn. Res.*, vol. 174, pp. 78-87, May 2005), but could be carried out using other algorithms. While nonlinear optimization results in a simple problem formulation, it does not give particular insight into the solutions available, nor does it guarantee a global minimum. Specifying a target field without regard to what is feasible within the constraints of Maxwell's equations is also dangerous as unrealistic target fields can lead to poor solutions. To address these problems, we consider analytical techniques for optimizing the Taylor expansion of $\vec{B}$ about a single point in space. This method transforms the optimization into a linear system of equations which are easily solved, and at the same time provides substantial insight into the design problem. For more complex designs, a hybrid approach is proposed in which basic field characteristics are specified using the Taylor expansion method and higher order corrections are made using nonlinear optimization. For simplicity, we introduce this method in Cartesian coordinates, and then expand upon it in the other coordinate systems considered.

Cartesian Coordinates Taylor Expansion Optimization

From symmetry, the problem is best specified with a ROI located some distance $y_d$ above the x-origin. In all cases, a choice exists regarding the principal direction of $\vec{B}$. The sign of the potential can be thought of as denoting its pole, ie. positive potential denotes a north pole and negative potential a south. From (16), the potential consists of both sine and cosine terms. A sinusoidal potential has odd symmetry about the origin, translating into a north on one side and a south on the other. The field will therefore curl between them, and be x-directed over the origin. A cosinusoidal potential will analogously behave as a single pole due to even symmetry, and produce a field that is y-directed over the origin. As will be discussed in further detail with reference to FIGs. XX, the scalar potential approach better lends itself to a field directed perpendicular to the magnet array, and therefore it is these solutions that will be considered here although the analysis is easily applied to the x-directed case.

Setting $c_n=0$ for odd symmetry and taking the derivative of (16) gives $$\vec{B} = \frac{\partial \phi}{\partial x}\hat{x}\frac{\partial \phi}{\partial y}\hat{y} \quad (20)$$

$$= \sum_{n=0}^{N} nab_n e^{-nay}[-\sin(nax)\hat{x} - \cos(nax)\hat{y}].$$

At a point (x, y)=(0, y) over the origin, the field is y-directed and its magnitude is $$|\vec{B}(0, y)| = \sum_{n=0}^{N} nab_n e^{-nay}. \quad (21)$$

Taking the $i^{th}$ derivative of (21) with respect to y gives $$\left.\frac{\partial^i |\vec{B}|}{\partial y^i}\right|_{\substack{x=0\\y=y_d}} = \sum_{n=1}^{N} (-1)^i (na)^{i+1} b_n e^{-nay}. \quad (22)$$

A common MR compatible field consists of a specified value $B_0$ with a constant gradient field superimposed such that $\vec{B}=(B_0+Gy)\hat{y}$. Because the actual strength of the field will vary with the magnets used, it is better to write $\vec{B} \propto (1+(G/B_0)y)\hat{y}$, defining the gradient in proportion to the main field. To achieve this field, $|\vec{B}|$ is set to unity at the desired location ($y=y_d$) and its first derivative set to the ratio $G/B_0$. Depending on the degree of uniformity that is desired, a number of higher derivatives are set to zero. These constraints can be concisely summarized as $$\begin{bmatrix} ae^{-ay_d} & 2ae^{-2ay_d} & \cdots & nae^{-Nay_d} \\ -ae^{-ay_d} & -(2a)^2 e^{-2ad} & \cdots & -(Na)^2 e^{-Nay_d} \\ \vdots & \vdots & \ddots & \vdots \\ (-1)^i(a)^{i+1} e^{-ay_d} & (-1)^i(2a)^{i+1} e^{-2ay_d} & \cdots & (-1)^i(Na)^{i+1} e^{-Nay_d} \end{bmatrix} \quad (23)$$

$$\begin{bmatrix} b_1 \\ b_2 \\ \vdots \\ b_n \end{bmatrix} = \begin{bmatrix} B_0 \\ G_y \\ \vdots \\ 0 \end{bmatrix}$$

and the undetermined coefficients can be calculated by matrix inversion. While it is desirable to have the field as uniform as possible, setting a large number of derivatives to zero will result in a complex and potentially difficult to realize solution. In practice we have found that choosing N=3 and setting the $2^d$ derivative to zero is sufficient for many purposes. Furthermore, because of the approximations used in the Cartesian solution, there will inevitably be discrepancies between what is designed and what is built and there is therefore little value in developing an overly complex solution with this formulation.

Polar Coordinates Taylor Expansion Optimization

The gradient of (17) is $$\vec{B} = \nabla \phi \quad (24)$$

$$= \frac{\partial \phi}{\partial \rho}\hat{\rho} + \frac{1}{\rho}\frac{\partial \phi}{\partial \psi}\hat{\psi}$$

$$= \sum_{n=1}^{N} [-nb_n \rho^{-n-1}\cos(n\psi) - nc_n \rho^{-n-1}\sin(n\psi)]\hat{\rho} +$$

$$\sum_{n=1}^{N} [-nb_n \rho^{-n-1}\sin(n\psi) - nc_n \rho^{-n-1}\cos(n\psi)]\hat{\psi}.$$

Choosing a field directed normal to the magnet array gives the condition $B_\psi(\rho_0\pi/2)=0$ which can be achieved by setting $$-nb_n\rho^{-n-1}\sin\left(\frac{n\pi}{2}\right) + nc_n\rho^{-n-1}\cos\left(\frac{n\pi}{2}\right) = 0. \quad (25)$$

Consequently, $$b_n = 0, \sin\left(\frac{n\pi}{2}\right) \neq 0$$

$$c_n = 0, \cos\left(\frac{n\pi}{2}\right) \neq 0$$

or $c_n=0$ for odd n and $d_n=0$ for even n. Defining $a_n=\{0, c_2, d_3, c_4, \ldots\}$, the magnetic field at the point of interest is $$\vec{B} = B_r \hat{\rho} = \sum_{n=1}^{N} n a_n \rho_0^{-n-1} T(n) \hat{\rho} \quad (26)$$

where $T(n) = \{1, -1, -1, 1, 1, \ldots\} = -1^{\lfloor (n-1)/2 \rfloor}$ accounts for the changing sign of nonzero sine/cosine terms. The term $a_1$ has been set to zero to ensure that the field falls off with $\rho^{-3}$ as discussed earlier. The $i^{th}$ derivative of the field in the radial direction is $$\frac{\partial^i |\vec{B}|}{\partial B^i} = \sum_{n=1}^{N} \left[ \prod_{k=0}^{i} (-n-k) a_n \rho^{-n-1-i} T(n) \right]. \quad (27)$$

To control the first i derivatives, i non-zero terms are required, giving N=i+2. The resulting system of equations can be solved to give the coefficients. Two-dimensional designs in both of the previous coordinate systems have the advantage that they can be arbitrarily extended in the z-direction to give a long sensitive volume.

Spherical Coordinates Taylor Expansion Optimization

The spherical coordinate solution can be simplified dramatically by assuming axial symmetry about z, ie.

$$\frac{\partial}{\partial \psi} = 0.$$

This symmetry will naturally only admit fields which are z-directed over the origin and thus normal to a magnet which is designed in the r$\theta$ plane. Axial symmetry is enforced by setting m=0 in (18) giving $$\phi_{r\theta\psi} = \sum_{n=1}^{N} c_n r^{-n-1} P_n(\cos\theta) \quad (28)$$

where the associated Legendre polynomial $P_n^0$ degenerates to the Legendre polynomial $P_n$. Axial symmetry about the x-axis is also possible. However, choosing the solution (28) conveniently removes the double summation from the potential. Optimizing the field without axial symmetry would be most convenient in a design requiring a sensitive volume that is long compared to its width and height, as is common in oil logging instruments. Cylindrical coordinates may be more appropriate in this case. An asymmetric solution is straightforward but tedious, and for illustrative purposes, we limit the discussion here to the solution (28).

The associated magnetic field is $$\vec{B} = \frac{\partial \phi}{\partial r} \hat{r} + \frac{1}{r} \frac{\partial \phi}{\partial \theta} \hat{\theta} \quad (29)$$

$$= \sum_{n=1}^{N} (-n-1) c_n r^{-n-2} P_n(\cos\theta) \hat{r} +$$

-continued $$\sum_{n=1}^{N} c_n r^{-n-2} \frac{d P_n(\cos\theta)}{d\theta} \hat{\theta}.$$

Along the z-axis, we have $\theta=0$ so $$\frac{d P_n(\cos\theta)}{d\theta} = \frac{-\sin\theta \, d P_n(\cos\theta)}{d(\cos\theta)} = 0$$

and there is no $\hat{\theta}$ component of the field. Conveniently, $P_n(1) = 1$ and so the field expression reduces to $$\vec{B}(r,0) = B_r \hat{r} = (-n-1) c_n r^{-n-2} \hat{r}. \quad (30)$$

The derivatives are therefore $$\left. \frac{\partial^i B_r}{\partial r^i} \right|_{\theta=0} = \sum_{n=1}^{N} \prod_{k=0}^{i} (-n-k-1) c_n r_0^{-n-2-i} \quad (31)$$

which is essentially the same as the expression (27) for polar coordinates. By constraining the field and its derivatives, the coefficients can be determined as before.

While in all three cases, the expansion has focused on the field derivatives along the direction perpendicular to the magnet, a similar analysis can be carried out concerning the derivatives in other directions. However, the spatial derivatives of $\vec{B}$ are intimately linked through Maxwell's equations $\nabla \cdot \vec{B} = 0$ and $\nabla \times \vec{H} = 0$, and care must be taken to ensure the constraints imposed on the solution are linearly independent.

While constraining the field at a single point in space using (22), (27) or (31) may be sufficient in some design applications, more precise control over the field may also be desired. In cases where $|\vec{B}|$ must be controlled over an area or volume, working out an analytical solution for the appropriate coefficients may be impossible. In these cases, a hybrid approach can be used in which basic features of the field are controlled by constraining the derivatives, while higher order terms are used to optimize $|\vec{B}|$ using (19). This method is discussed here in the context of spherical coordinates as the tight control of the field this formulation affords makes it most suited to more complex optimizations.

Nonlinear optimization will generally vary the free parameters to minimize a goal function. Setting N derivatives at a given point and using M higher order terms to correct the field over a larger area, (31) becomes $$\left. \frac{\partial^i B_r}{\partial r^i} \right|_{\theta=0} = \sum_{n=1}^{N} \prod_{k=0}^{i} (-n-k-1) c_n r_0^{-n-2-i} +$$

$$\sum_{n=N+1}^{N+M} \prod_{k=0}^{i} (-n-k-1) c_n r_0^{-n-2-i}$$

$$= B_{TAR}^i$$

where $B_{TAR}^i$ is the $i^{th}$ derivative of the target field at the chosen point. Rearranging gives $$\sum_{n=1}^{N}\prod_{k=0}^{i}(-n-k-1)c_n r_0^{-n-2-i} = B_{TAR}^i - \sum_{n=N+1}^{N+M}\prod_{k=0}^{i}(-n-k-1) \quad (32)$$

$$c_n r_0^{-n-2-i}$$

which results in i equations and unknowns through which $c_n$ can be found for $n \leq N$. The coefficients for $n > N$ are then determined through a nonlinear optimization according to (19). By constraining the gross features of the field, the solution space is dramatically reduced, leading to faster optimizations, and robustness to local minima.

Pole Piece Contour Selection

With the optimal coefficients determined, the task now becomes to select one or more appropriate contours of $\phi$ to define the metal pole pieces used to control the field. When determining these contours, the primary considerations are: (1) Complexity; contours with very complicated shapes may be very difficult to manufacture. Selecting contours which will result in a larger number of magnets will also make manufacturing difficult and may have additional safety concerns when setting the magnets together. (2) For a UMR instrument, the obvious constraint is that the pole piece must lie below the plane of the sample. (3) Sufficient spacing must be left between the pole face and sample volume to accommodate a RF coil, and to allow appropriate penetration into the sample.

The selection process is illustrated here through an example design in polar coordinates and is readily extended to the other solutions. In this simple case, we consider a design in which the ratio $G/B = 0.02$ cm$^{-1}$ at a radius $r_0 = 5$ cm, with the second field derivative set to zero. Solving the system of equations given by (27) gives a scalar potential function with contours as indicated by the dashed lines in FIG. 20. The target spot is indicated by the x in the figure.

Figure 20:
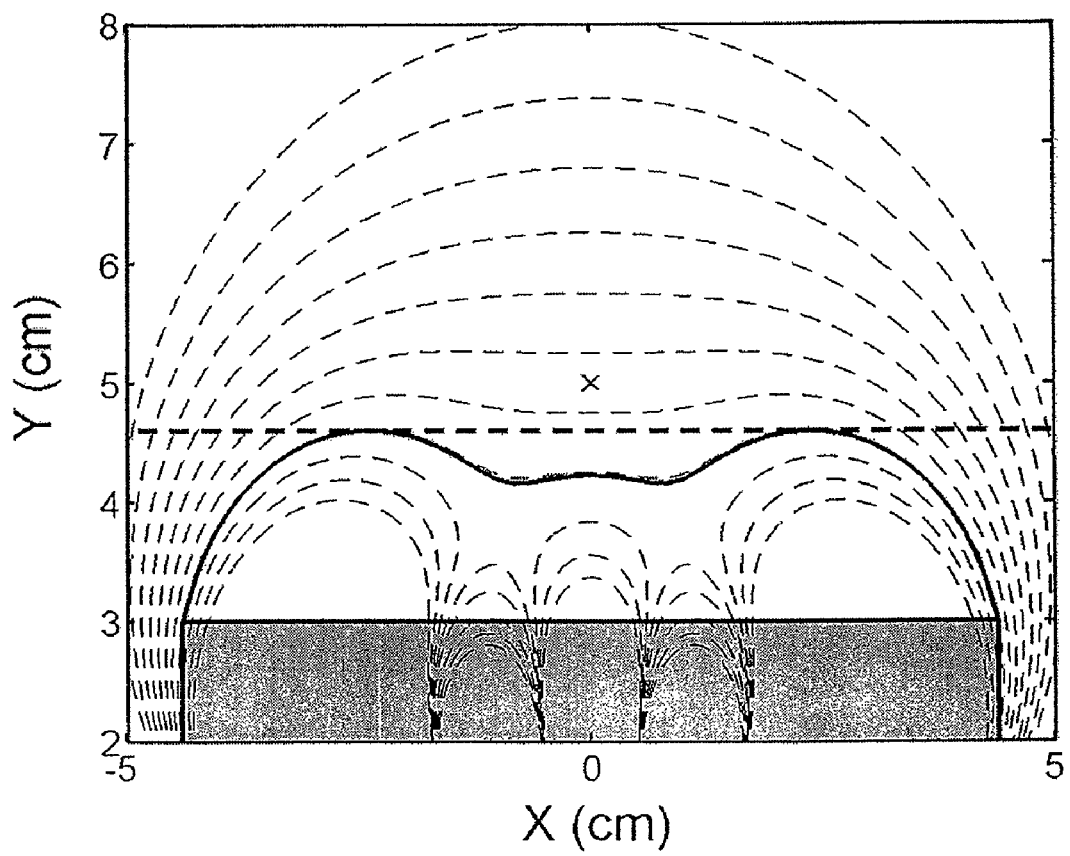
FIG. 20 illustrates a scalar potential function with contours indicated by dashed lines caused by the example design pole piece having a contour indicated by a solid curved line.

For smaller y, the contour lines define five distinct lobes, which eventually become three and then one. The widths of the magnets and pole pieces are defined by the intersection of the contours with a line along x at a chosen y. Selecting multiple lobes as contours implies multiple magnets. In this case, this would result in three or five magnets immediately adjacent and all oriented in the same direction. Consequently, the magnets would naturally be repelled from one another. With the rare earth magnets used in these applications, the repulsive forces are very strong and special assembly procedures along with a reinforced housing would be required for the array. A failure in the housing could result in one or more magnets repelled at high speed from the structure and thus represents a substantial safety concern. A further disadvantage of selecting multiple lobes is that the inward curvature most easily seen in the larger lobes on either side of FIG. 20 is difficult to machine with a 3-axis mill.

Based on these considerations, the contour which is approximately the lowest in y but still defines a single lobe is selected. This has maxima occurring at the line $y = 4.6$ cm indicated by the thick dashed line in the figure. The maximum value of $\phi$ along this line is computed using (18) to define $\phi_c$, the potential of the contour. While the coordinates of the contour can be determined from the contour plot, it is more convenient to express the curve as an equation, especially when using the data for simulation or fabrication. The contour r(9) can be calculated by writing (18) as $$\sum_{n=2}^{N} Q(n)(R)^n - \phi_c = 0 \quad (33)$$

where $Q(n) = c_n \cos(n\theta) + d_n \sin(n\theta)$ and $R = 1/r$.

If $R_i(\theta)$ is a real root of (33) the contour is $$r(\theta) = \frac{1}{R_i(\theta)}. \quad (34)$$

It is important to select the correct root $R_i(\theta)$ which corresponds to the real contours of scalar potential. The appropriate i can vary with $\theta$ and it is best to compare the calculated curve with a contour plot of $\phi$ to ensure the correct selection has been made. The contour for the example design as given by (34) is represented by the curved solid line in FIG. 20. The pole piece will sit atop a permanent magnet and hence a bottom plane must also be defined. The choice should ensure that as much of the contour shape as possible is captured, at the same time making sure it is readily manufactured and not overly thick in y which could result in a reduction in field strength due to fringing. In this case, $y = 3$ cm has been selected. The permanent magnet will occupy the shaded area. Its thickness in y will have a scaling effect on the strength of the magnetic field. In this case, the north pole is at the top of the magnet. Both the pole and magnet are extended in z to give an assembly which is sufficiently long that end effects in this direction can be neglected at the center. The choice of length is explored using this example in detail further below under the heading END EFFECTS.

In some cases, the optimized contours will not stay below the plane of the sensitive spot. A specific problem we have often encountered is the outer maxima in a single connected contour rising up above this region. This often occurs when the constraints placed on field uniformity are beyond what can be achieved in free space above the magnet. Solutions to this problem include increasing the radius $r_0$ at which the field is specified. This has the effect of widening the pole contours, effectively scaling up the magnet size which can give a uniform region over a larger extent. It is also possible to constrain the shape of the pole with a hybrid optimization scheme in order to trade off field uniformity with the maximum extent of the pole. If all else fails, it is still possible to select contours which define more than one lobe in the magnet array. Contours of different strengths can be selected, with the thicknesses of the magnets scaled accordingly. A sign change in contours implies a reversal in the orientation of the magnet.

Notice in FIG. 20 that over the center of the pole, the contours are reasonably flat along x and have a relatively even spacing along y. This corresponds to a somewhat uniform field which is principally ŷ-directed since $\vec{B}$ is defined as the gradient of the scalar potential. For a design in which the field is directed parallel to the face of the magnets, these contour lines must be vertical and again must be spaced relatively evenly for a uniform field. Because the pole shapes correspond to contours of $\phi$, it is easy to see that it is much more difficult to generate a uniform field in the x̂-direction while retaining a unilateral design using this method. Although it can be done (see P. J. McDonald, J. Mitchell, M. Mulheron, P. S. Aptaker, J.-P. Korb, and L. Monteilhet, "Two dimensional correlation relaxometry studies of cement pastes performed using a new one-sided NMR magnet," Cement Concrete Res., to be published; and A. E. Marble, I. V. Mastikhin, B. G.

Colpitts, and B. J. Balcom, "An analytical methodology for magnetic field control in unilateral NMR," J. Magn. Res., vol. 174, pp. 78-87, May 2005), generating a field in this direction will generally result in a more complicated design, a lack of precise control over the field characteristics, and a weaker field.

End Effects

The finite extent of a magnet designed in the xy plane and extended linearly along z will introduce a curvature in the field, conflicting with the assumption $$\frac{\partial}{\partial z} = 0$$

used in the solutions (16) and (17) to Laplace's equation. If the extent of the magnet in z is large, the curvature at the center can be neglected. However there will remain a finite extent over which the design is valid. This extent is somewhat dependent on the design, as the 2D characteristics of the magnetic field will influence the curvature in the third dimension. We have found that there is some validity in considering the curvature in the field over a long bar magnet and using this as a guide in selecting an appropriate length. While this allows a simple solution which may be used as a rule of thumb, it is not general, and it is better to simulate a 2D design in three dimensions to determine the effect of the finite extent of the magnets.

Figure 21:
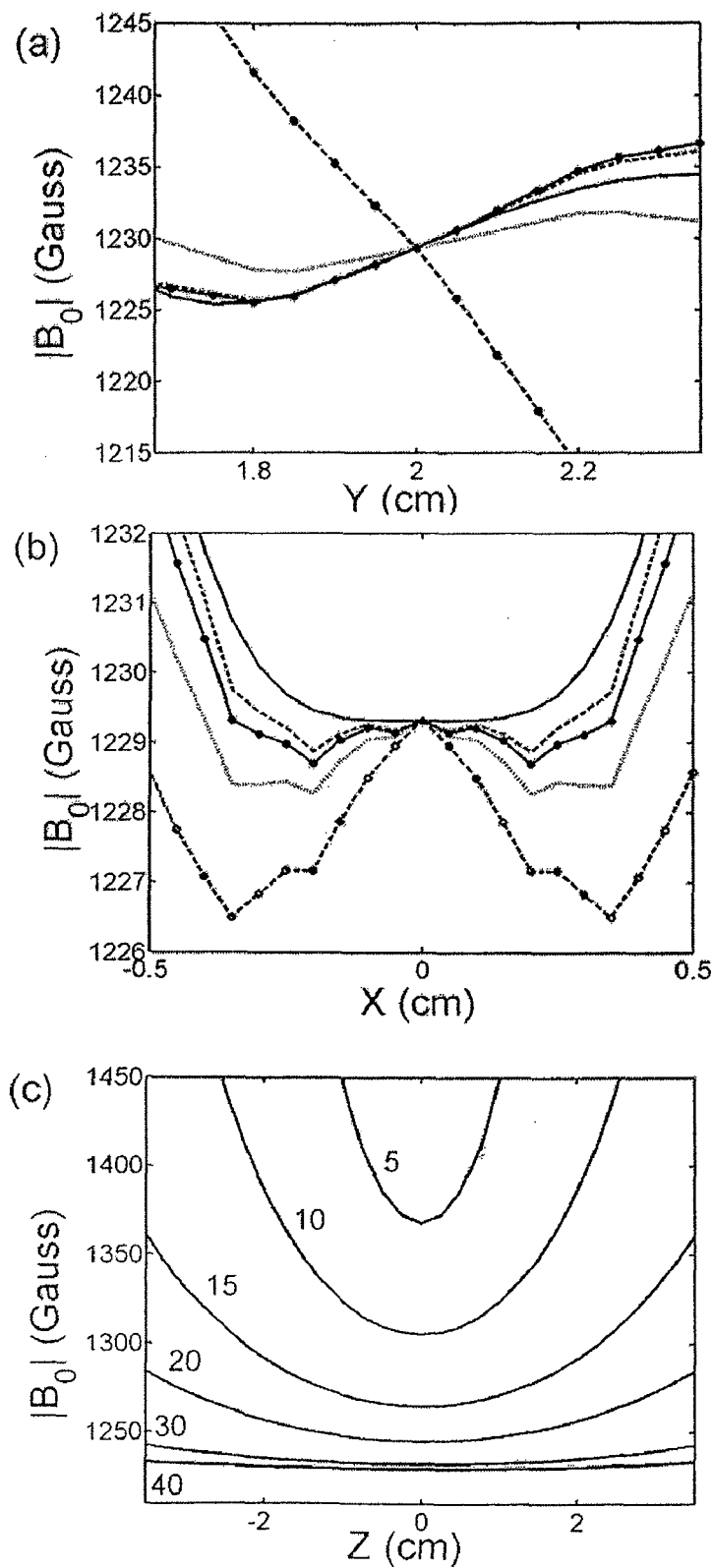
FIG. 21 illustrates the fields near the target region for different magnet lengths for the example design pole piece of FIG. 20.

To explore these effects, we have simulated the design presented in FIG. 20 for various magnet lengths L along z using Opera 3D (Vector Fields, Aurora Ill.). This tool reported weighted RMS field error estimates of between 0.82% and 1.04% for the simulations. The thickness of the magnets in y remained constant at 5 cm in all cases. The magnets were assumed to be NdFeB with a remanance of 12 kG and the metal was modeled as 1010 steel. FIG. 21 compares the fields near the target region for different magnet lengths. In FIG. 21(a), the field magnitude at (x,z)=(0,0) is plotted along y for array lengths of 40 cm, 20 cm, 10 cm, and 5 cm along with the field calculated using (24). The y-axis has been shifted so that the origin corresponds with the top of the magnet shown in FIG. 21 All values were scaled to correspond to the simulated value for L=40 cm at y=2 cm for comparison purposes. As specified in the design, the calculated field has a linear, positive gradient with a value equal to 2% of the field strength in a region centered about y=2 cm. For lengths of 20 cm and 40 cm, the simulated fields agree closely with the calculated value, deviating slightly at larger y. With a length of 10 cm, a positive, linear gradient is observed although the gradient value has decreased and the field no longer matches the design. With a 5 cm length, there is no correspondence between the simulated and calculated fields.

FIG. 21(b) gives the simulated and calculated fields on a line along the x direction in the center of the target region, at (z,y)=(0,2.5) for the same magnet lengths as in plot (a). Again, the fields have been scaled to correspond to the calculated value with L=40 at x=0 cm. In this case, there is a slight deviation between the simulated and calculated fields even for the 20 cm and 40 cm magnets. The jaggedness of the curves at this scale indicates that there is some quantization due to the simulation. However, the character of the field deviation remains the same for the shorter magnets so the discrepancy is likely a real effect. Over the central flat region, the fields for L=20 cm and 40 cm are within 1 Gauss of the calculated field, and even the two shorter magnets have fields within around 3 Gauss from the calculation. Plots (a) and (b) indicate a breakdown in the assumption that the field derivative with respect to z is zero over the origin. The resulting discrepancy is likely most prominent in plot (a) where the design is completely compromised for short magnet lengths.

Along z, it is desired that the field remain flat over the largest extent possible. FIG. 21(c) illustrates the reality, comparing simulated fields along z for array lengths as indicated in the figure. The field is plotted along a line centered in the target region. In this case the fields have not been scaled, and the field strength is observed to increase as magnet length decreases, due to fringing from the magnet edges. In each case, it is clear that the field remains flat only over a very small portion in the center of the magnets. The tolerable field curvature will depend on the specific application but these results show that the extent of the magnets cannot be ignored.

Although not explicitly shown in the drawing, it is contemplated to reduce field curvature either by adjusting the strength of the magnet along the array (see B. Luong, J. C. Goswami, A. Sezginer, D. Davies, "Optimal control technique for magnet design in inside-out nuclear magnetic resonance," IEEE Trans. Magnetics, vol. 37, pp. 1015-1023, March 2001 or adding a gap in the magnet (see J. Perlo, F. Casanova, and B. Blümich, "Profiles with microscopic resolution by single-sided NMR," J. Magn. Res., vol. 176, pp. 64-70, September 2005).

Sample Magnet Design

In order to demonstrate the utility of the techniques developed under the heading GENERAL SOLUTION TO SCALAR POTENTIAL IN SPHERICAL COORDINATES above, we now discuss a magnet and pole piece, designed in spherical coordinates. The design uses axial symmetry, and requires a constant magnetic field gradient in z equal to 10% of the field strength. It is desired to have the field meet these requirements in a region at least 2 mm thick in z and 2 cm in diameter, with the target volume centered 5 mm above the face of the magnet.

Because of the constant gradient desired, it is logical to specify the gradient and its derivative according to (31) to give a first approximation of the desired field. While the field would ideally be perfectly flat in the target region, zeroing its second derivative with respect to y is incompatible with the constant gradient constraints, and a hybrid approach was adopted instead. Using (32), the parameters were optimized to solve (19) over the target region specified, subject to the gradient being constant to second order. The optimization used N=3 as required to specify the constant gradient and M=3 chosen as a compromise between solution accuracy and design complexity.

Figure 22:
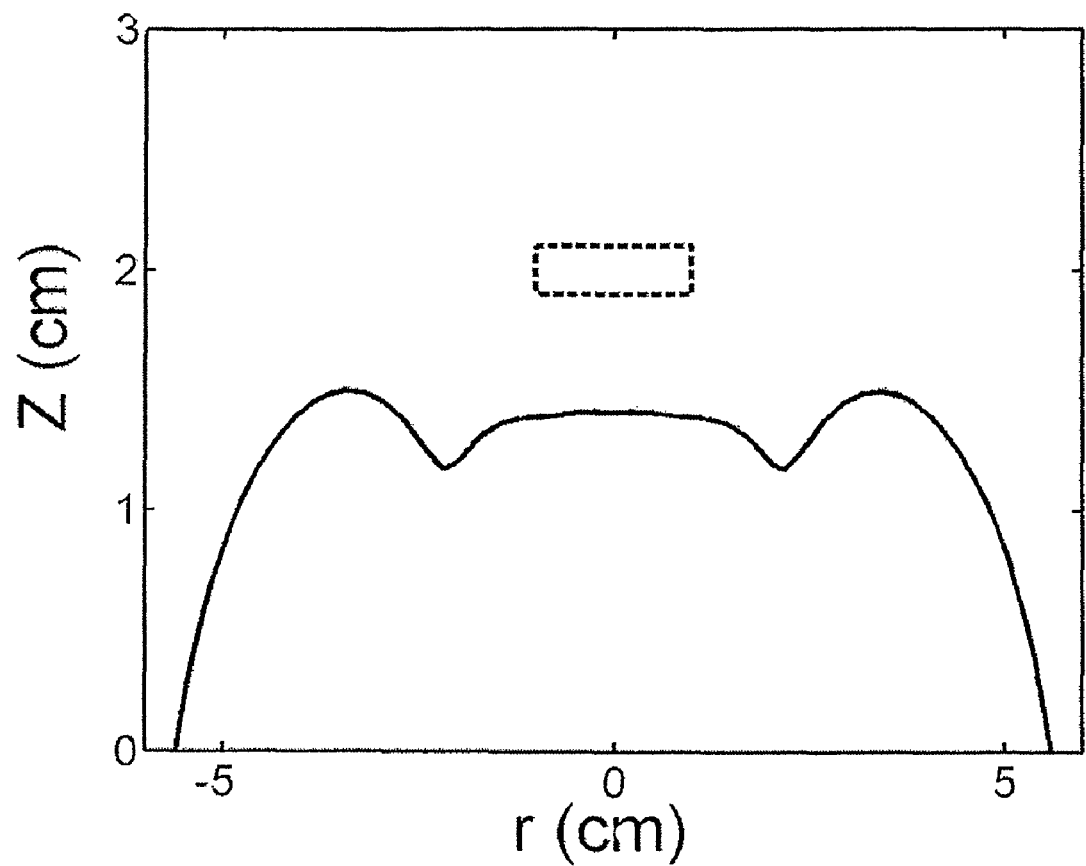
FIG. 22 illustrates an example design pole piece having a contour indicated by a solid curved line.
Figure 23:
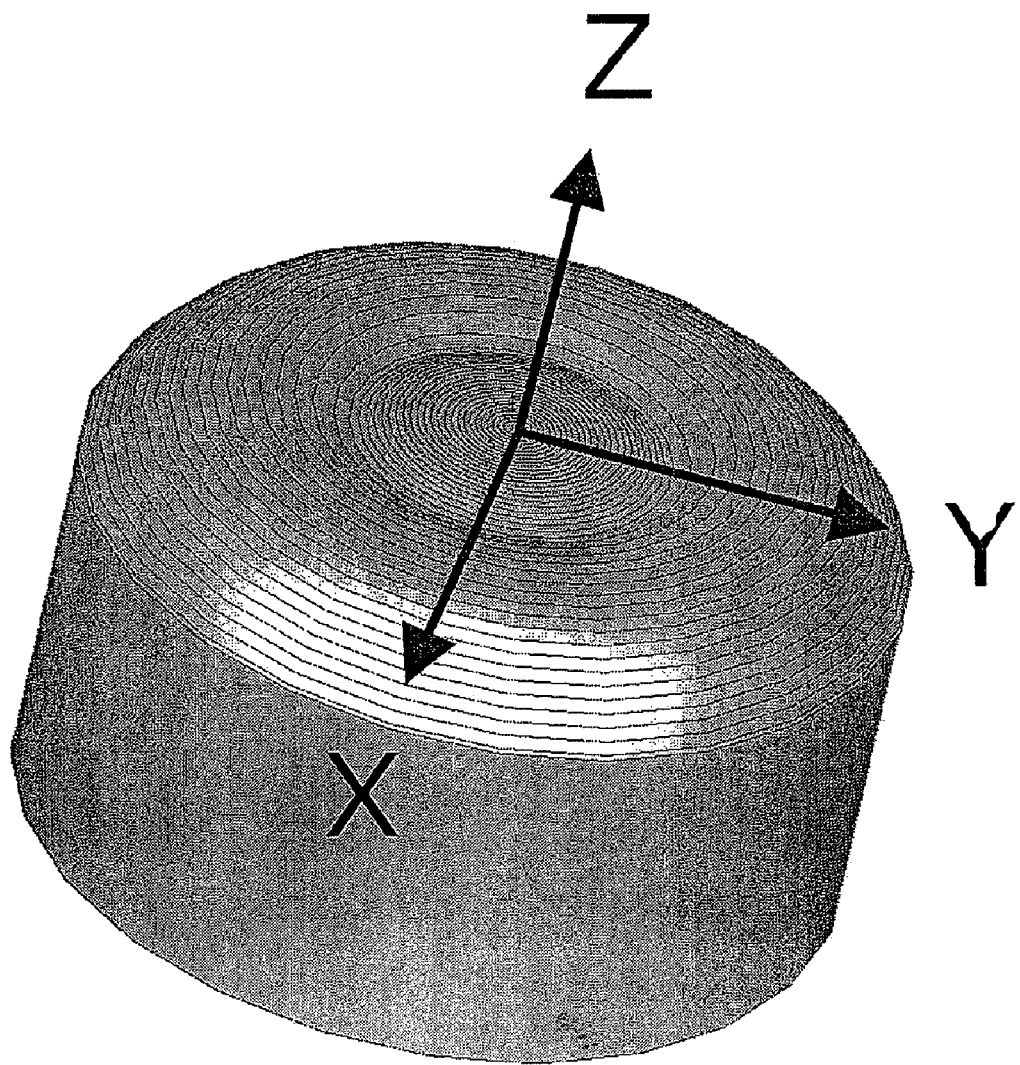
FIG. 23 illustrates an example 3D CAD drawing of the example pole piece of FIG. 22 as part of a magnet assembly with a corresponding cylindrical magnet.

Single contours of φ existed with extrema 5 mm below the target region and therefore no additional optimization was required in this regard. This is more common when a large gradient is desired which generally results in a flatter pole. The selected contour is plotted in FIG. 22, with the target volume highlighted above it. A 3D CAD drawing of the pole piece along with a cylindrical magnet appears in FIG. 23. The magnet assembly is just over 11 cm in diameter.

Figure 24:
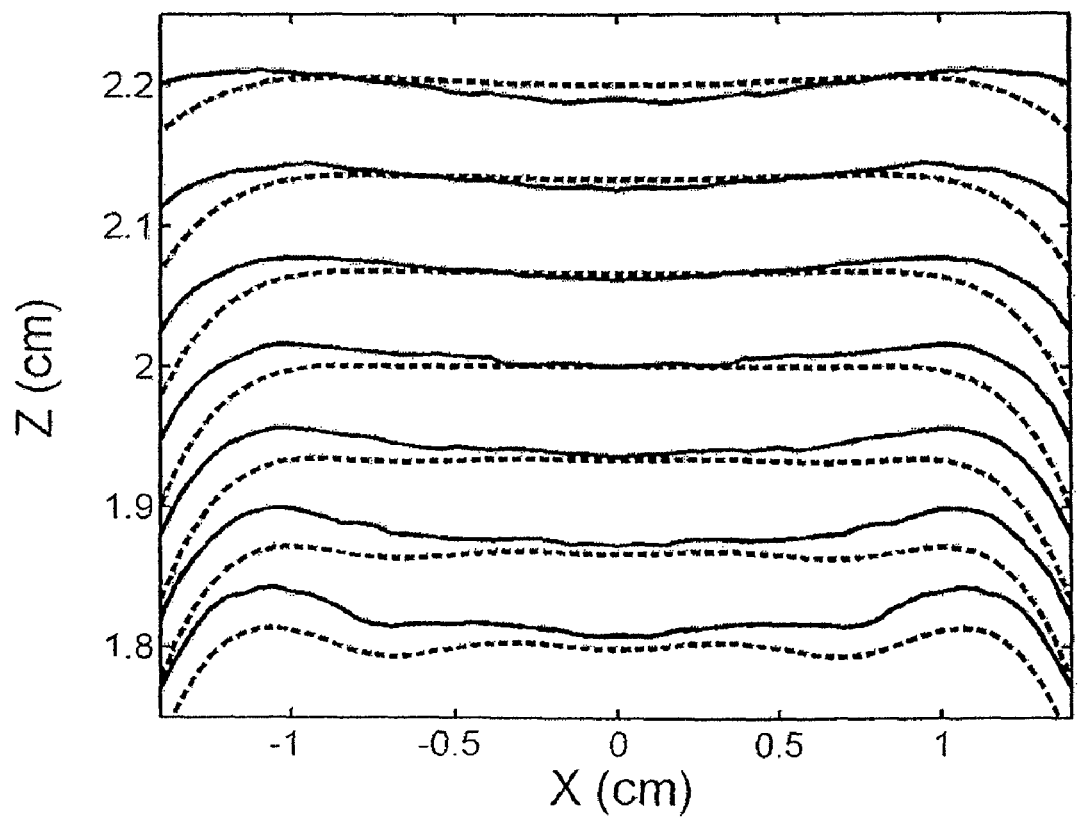
FIG. 24 is a plot comparing the simulated contours with calculated optimized values for the example magnet assembly of FIG. 23.

The magnetic field from this assembly was simulated making the same assumptions regarding materials as in described above under the heading END EFFECTS, with a magnet thickness of 5 cm. The simulation tool reported a weighted RMS field error estimate of 0.80%. FIG. 24 compares the simulated contours with the optimized values calculated according to (29), scaled to match the simulated value at the center of the target region. In the target region, between x=±1 cm and z=1.9-2.1 cm, excellent agreement is noted, with deviation between the two results increasing at larger |x|. The contour spacing remains nearly constant over the entire z-extent of the plot, indicating that the region of constant gradient is larger than specified in the design. Both fields fall off rapidly along x outside of the target region. Some of the discrepancy observed is likely due to numerical effects in the simulation, including quantization of the solution domain and the pole piece profile. Another source of error may be the truncation of the pole piece as compared to the theoretical potential distribution. In FIG. 20, below the interface between the pole piece and the magnet, the contour lines are vertical just outside of the magnet indicating a x-directed field. However, a permanent magnet will generate a substantial field in the −y-direction which will have a small effect on the field everywhere. A similar effect could be responsible for the small discrepancy in FIG. 24. Nevertheless, rigid control over the magnetic field external to the magnet has been achieved. The design generates a MR compatible field over a spot 2 cm in diameter using a magnet only 11 cm in diameter which is markedly more efficient than designs using other coordinate systems. The axial symmetry ensures that this field distribution exists in all directions over the magnet, and no approximations regarding the field quality away from the center of the target region are required.

Another important feature of this design process is that the magnetic field topology will scale with the size of the magnet and pole. For example, all dimensions in the design presented here could be scaled by a factor of 10. This would yield a permanent magnet just over 1 m in diameter. Considering the field shown if FIG. 24, the sensitive volume of this scaled magnet would be 4 cm thick and 20 cm in diameter, while the gradient would be reduced to 1% of the field strength. Such a magnet may be well suited to medical imaging applications providing a completely open volume in which diagnostic imaging could be performed.

Figure 25:
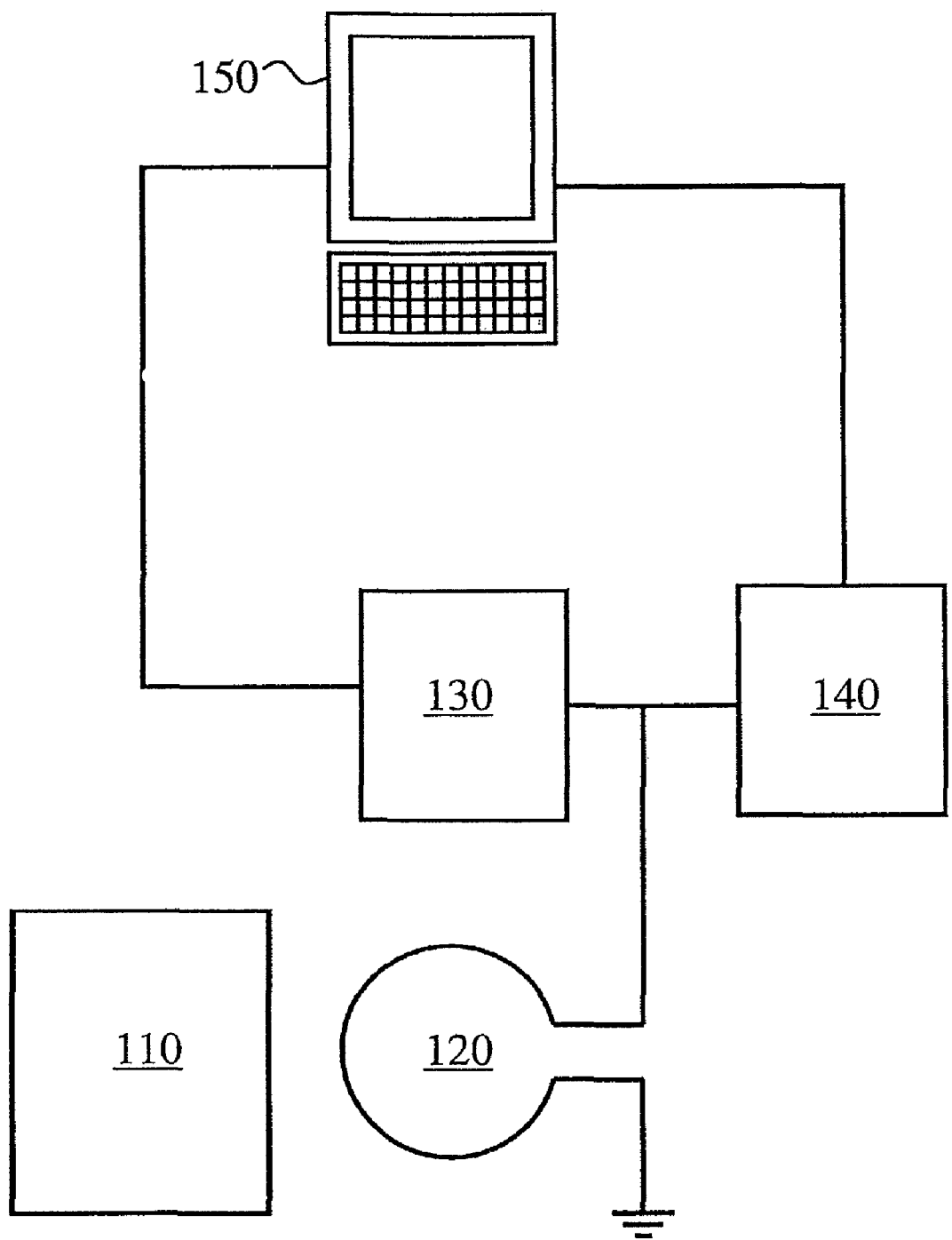
FIG. 25 is a block diagram of an embodiment of and NMR apparatus provided in accordance with the present invention.

FIG. 25 is a block diagram of one embodiment of an NMR apparatus provided in accordance with the present invention. The magnet array 110 produces a suitable static magnetic field in a region of interest. The dynamic field generator 120 generates a dynamic radiofrequency magnetic field in the region of interest. The RF supply module 130 is connected to the dynamic field generator and supplies an RF signal compatible with nuclear magnetic resonance to the dynamic field generator. The detection module 140 detects nuclear magnetic resonance signals induced in the dynamic field generator. The RF supply module is controlled with a computer 150, and the signals detected by the detection module are recorded and processed on the computer.

The above-described embodiments of the present invention are intended to be examples only. Those of skill in the art may effect alterations, modifications and variations to the particular embodiments without departing from the scope of the invention, which is set forth in the claims.

We claim

1. A magnetic field generator apparatus suitable for use in unilateral nuclear magnetic resonance, the magnetic field generator generating a field in a region of interest, the magnetic field generator comprising:
at least one magnet having a pole; the width of the at least one magnet at the pole substantially coinciding with the distance between two portions of a first contour line of a magnetic scalar potential obtained by solution to Laplace's equation, the magnet positioned relative to the region of interest so that the width of the at least one magnet coincides with the two portions of the first contour line; whereby the field generated by the at least one magnet in the region of interest substantially matches with the gradient of the magnetic scalar potential.

2. The magnetic field generator apparatus as recited in claim 1, wherein the first contour line is easily machined.

3. The magnetic field generator apparatus as recited in claim 2, wherein the first contour line is below the region of interest.

4. The magnetic field generator apparatus as recited in claim 2, wherein the first contour line has two portions that are substantially parallel to the sides of the at least one magnet.

5. The magnetic field generator apparatus as recited in claim 1, further comprising at least one pole piece whose profile substantially coincides with a second contour line of the magnetic scalar potential, the at least one pole piece positioned relative to the region of interest so that the at least one pole piece profile substantially coincides with the second contour line of the magnetic scalar potential, thereby increasing the degree with which the field generated in the region of interest substantially matches with the gradient of the magnetic scalar potential.

6. The magnetic field generator apparatus as recited in claim 2, wherein the second contour line is easily machined.

7. The magnetic field generator apparatus as recited in claim 2, wherein the second contour line is below the region of interest.

8. The magnetic field generator apparatus as recited in claim 2, wherein the second contour line has two portions that are substantially parallel to the sides of the at least one magnet.

9. The magnetic field generator apparatus as recited in claim 2, wherein the second contour line substantially coincides with the first contour line.

10. The magnetic field generator apparatus as recited in claim 2, wherein the second contour line substantially differs from the first contour line.

11. The magnetic field generator apparatus as recited in claim 2, wherein the at least one pole piece only admits magnetic fields whose direction would be substantially normal to the magnetization direction of the at least one magnet in the region of interest.

12. The magnetic field generator apparatus as recited in claim 2, wherein the at least one pole piece only admits magnetic fields whose direction would be substantially parallel to the magnetization direction of the at least one magnet in the region of interest.

13. The magnetic field generator apparatus as recited in claim 2, wherein the at least one pole piece exhibits axial symmetry.

14. The magnetic field generator apparatus as recited in claim 2, wherein the at least one pole piece exhibits bilateral symmetry.

15. The magnetic field generator apparatus as recited in claim 1, wherein the at least one magnet comprises a magnet array.

16. The magnetic field generator apparatus as recited in claim 1, further comprising at least one dynamic field generator.

17. The magnetic field generator apparatus as recited in claim 16, wherein the dynamic field generator is a coil.

18. The magnetic field generator apparatus as recited in claim 16, wherein the dynamic field generator is positioned below the region of interest.

19. The magnetic field generator apparatus as recited in claim 16, wherein the dynamic field generator is positioned above the at least one magnet.

20. The magnetic field generator apparatus as recited in claim 16, further comprising an RF supply module connected to the at least one dynamic field generator suitable for generating an RF signal compatible with nuclear magnetic resonance.

21. The magnetic field generator apparatus as recited in claim 16, further comprising a detection module connected to the at least one dynamic field generator for detecting an RF signal compatible with nuclear magnetic resonance.

22. A method of making a magnetic field generator apparatus suitable for use in unilateral nuclear magnetic resonance, the magnetic field generator generating a field in a region of interest, the magnetic field generator comprising:
   (a) providing a pre-determined design requirement including a pre-determined magnetic field requirement within the region of interest;
   (b) determining a magnetic scalar potential satisfying Laplace's equation, the gradient of the scalar potential substantially coinciding with the pre-determined magnetic field requirement in the region of interest;
   (c) determining a first contour line of the magnetic scalar potential;
   (d) providing at least one magnet having a pole; the width of the at least one magnet at the pole substantially coinciding with the distance between two portions of the first contour line; and
   (e) positioning the magnet relative to the region of interest so that the width of the at least one magnet coincides with the two portions of the first contour line;
   whereby the field generated in the region of interest by the at least one magnet substantially matches with the gradient of the magnetic scalar potential.

23. The method as recited in claim 22, wherein the first contour line is easily machined.

24. The method as recited in claim 22, wherein the first contour line is below the region of interest.

25. The method as recited in claim 22, wherein the first contour line has two portions that are substantially parallel to the sides of the at least one magnet.

26. The method as recited in claim 22, further comprising the steps of:
   (a) determining a second contour line of the magnetic scalar potential;
   (b) providing at least one pole piece whose profile substantially coincides with the second contour line; and
   (c) positioning the at least one pole piece relative to the region of interest so that the at least one pole piece profile substantially coincides with the second contour line of the magnetic scalar potential;
   thereby increasing the degree with which the field generated in the region of interest substantially matches with the gradient of the magnetic scalar potential.

27. The method as recited in claim 26, wherein the second contour line is easily machined.

28. The method as recited in claim 26, wherein the second contour line is below the region of interest.

29. The method as recited in claim 26, wherein the second contour line has two portions that are substantially parallel to the sides of the at least one magnet.

30. The method as recited in claim 26, wherein the second contour line substantially coincides with the first contour line.

31. The method as recited in claim 26, wherein the second contour line substantially differs from the first contour line.

32. The method as recited in claim 26, wherein the at least one pole piece only admits magnetic fields whose direction would be substantially normal to the magnetization direction of the at least one magnet in the region of interest.

33. The method as recited in claim 26, wherein the at least one pole piece only admits magnetic fields whose direction would be substantially parallel to the magnetization direction of the at least one magnet in the region of interest.

34. The method as recited in claim 26, wherein the at least one pole piece exhibits axial symmetry.

35. The method as recited in claim 26, wherein the at least one pole piece exhibits bilateral symmetry.

36. The method as recited in claim 22, wherein the at least one magnet comprises a magnet array.

37. The method as recited in claim 22, further comprises the step of providing at least one dynamic field generator.

38. The method as recited in claim 37, wherein the dynamic field generator is a coil.

39. The method as recited in claim 37, further comprising the step of positioning the dynamic field generator below the region of interest.

40. The method as recited in claim 37, further comprising the step of positioning the dynamic field generator above the at least one magnet.

41. The method as recited in claim 37, further comprising the step of providing an RF supply module connected to the at least one dynamic field generator suitable for generating an RF signal compatible with nuclear magnetic resonance.

42. The method as recited in claim 37, further comprising the step of providing a detection module connected to the at least one dynamic field generator for detecting an RF signal compatible with nuclear magnetic resonance.

43. A method of making a pole piece suitable for use in combination with a magnet array to provide a magnetic pole piece assembly, the magnetic pole piece assembly suitable for use in magnetic resonance (MR) applications, the method comprising the steps of:
   (a) providing a pre-determined design requirement including a pre-determined region of interest (ROI) design requirement having a pre-determined volume requirement and a pre-determined position requirement, and a pre-determined magnetic field gradient strength requirement over the pre-determined volume of the ROI;
   (b) expressing an approximation of a magnetic field by using a finite number of summation operations of summands wherein the summands include a finite number of coefficients;
   (c) expressing approximate derivative of the approximation of a magnetic field in terms which include the finite number of coefficients;
   (d) relating at least one of the approximation of a magnetic field and the approximate derivative of the approximation of a magnetic field to the pre-determined design requirements so as to obtain a finite number of equations relating the finite number of coefficients to the pre-determined design requirements;
   (e) determining the number of coefficients using the finite number of equations and the pre-determined design requirements;
   (f) determining a magnetic scalar potential using the finite number of coefficients and the pre-determined design requirements; and
   (g) forming a pole piece whose surface coincides with at least one contour of the determined scalar potential.

44. The method as recited in claim 43, further comprising the step of applying a simplifying constraint.

45. The method as recited in claim 44, wherein the step of applying a simplifying constraint results in forming a pole piece that only admits magnetic fields whose direction would be substantially normal to the surface of the magnet array in the region of interest.

46. The method as recited in claim 44, wherein the step of applying a simplifying constraint results in forming a pole piece that exhibits symmetry.

47. The method as recited in claim 46, wherein the pole piece exhibits axial symmetry.

48. The method as recited in claim 46, wherein the pole piece exhibits bilateral symmetry.

49. The method as recited in claim 43 wherein the pre-determined magnetic field gradient strength requirement is substantially constant throughout the pre-determined volume of the ROI.

50. The method as recited in claim 43 wherein at least one summand corresponds to the gradient of a separation of variables solution to Laplace's equation in Cartesian coordinates.

51. The method as recited in claim 43 wherein at least one summand corresponds to the gradient of a separation of variables solution to Laplace's equation in Polar coordinates.

52. The method as recited in claim 43 wherein at least one summand corresponds to the gradient of a separation of variables solution to Laplace's equation in Spherical coordinates.

53. The method as recited in claim 43 wherein the approximate derivative is the $i^{th}$ derivative of the approximation of a magnetic field.

54. The method as recited in claim 43 wherein the finite number of equations are substantially linearly independent with regards to the finite number of coefficients.

55. The method as recited in claim 43 wherein the finite number of equations are optimized for solution over the ROI subject to the gradient being substantially constant to a pre-determined order.

56. The method as recited in claim 55, wherein the pre-determined order is 2.

* * * * *